(12) United States Patent
Takeuchi et al.

(10) Patent No.: US 6,411,011 B1
(45) Date of Patent: Jun. 25, 2002

(54) DISPLACEMENT CONTROL DEVICE AND ACTUATOR

(75) Inventors: Yukihisa Takeuchi, Aichi-prefecture; Koji Kimura, Nagoya, both of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/515,678

(22) Filed: Feb. 29, 2000

(30) Foreign Application Priority Data

Mar. 5, 1999 (JP) ............................................. 11-059505

(51) Int. Cl.[7] .............................................. H01L 41/09
(52) U.S. Cl. ....................................... 310/324; 310/328
(58) Field of Search ................................. 310/324, 328, 310/330, 331, 800

(56) References Cited

U.S. PATENT DOCUMENTS 5,166,571 A * 11/1992 Konno et al. ................ 310/333
5,767,612 A * 6/1998 Takeuchi et al. ............ 310/324
5,811,910 A * 9/1998 Cameron et al. ........... 310/324

OTHER PUBLICATIONS

Nakamura, S. et al., "An Electrostatic Micro Actuator for a Magnetic Head Tracking System of Hard Disk Drives" Tranducers '97, 1997 International Conference on Solid–State and Actuators, pp. 1081–1084.

* cited by examiner

Primary Examiner—Thomas M. Dougherty
Assistant Examiner—Michael C. Zarroli
(74) Attorney, Agent, or Firm—Burr & Brown

(57) ABSTRACT

A displacement control device is provided, including a substrate, two diaphragms joined to at least side surfaces of a recess section made in the substrate, and a connecting plate sandwiched between the two diaphragms and joined to a bottom surface of the recess section. At least one end portion of each of the two diaphragms is joined to the connecting plate and an opposite end portion thereof is joined to the substrate. At least two independent piezoelectric/electrostrictive elements are located at both the diaphragms, and the connecting plate is driven to create a hysteresis displacement locus. The displacement control device is properly applicable to mechanism for adjusting the displacement, the position or the angle of various kinds of precision parts, such as an optical unit, a rotating motor, a linear conveying apparatus, and others.

31 Claims, 12 Drawing Sheets

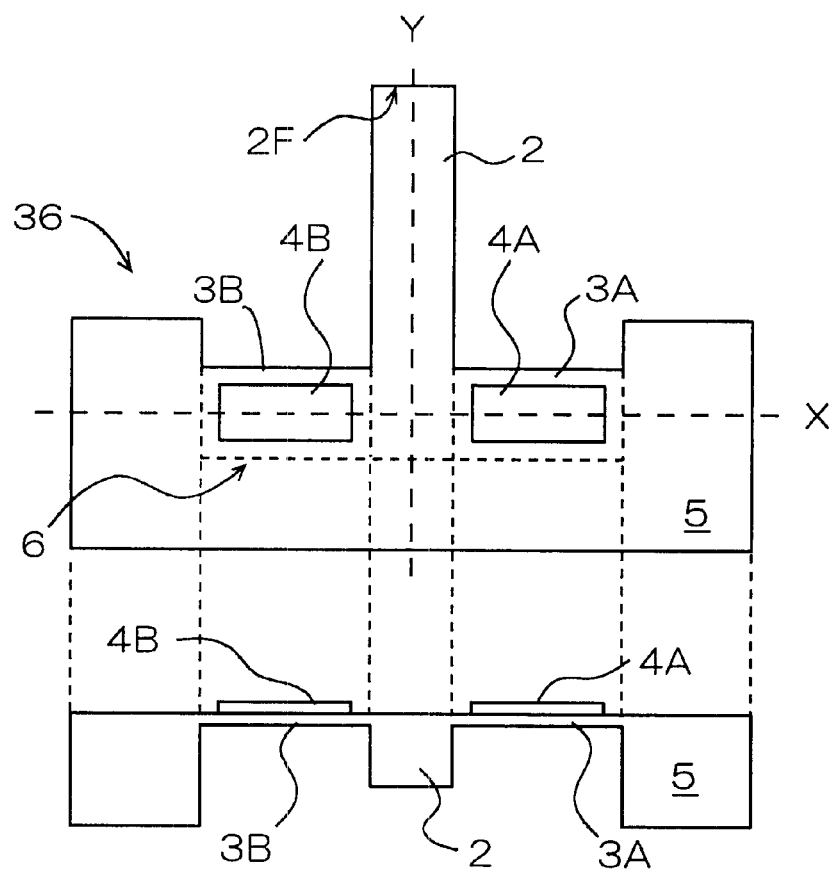
Fig.1A
Fig.1B
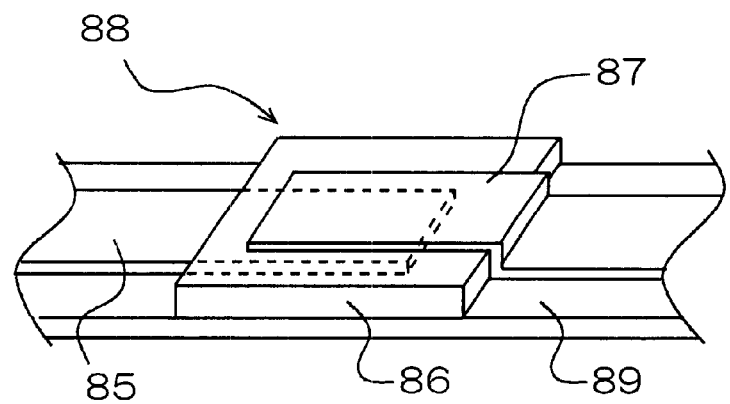
Fig.2

Fig.6
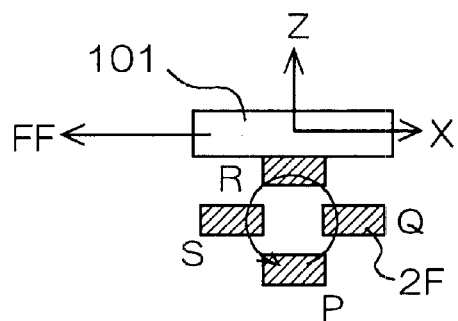
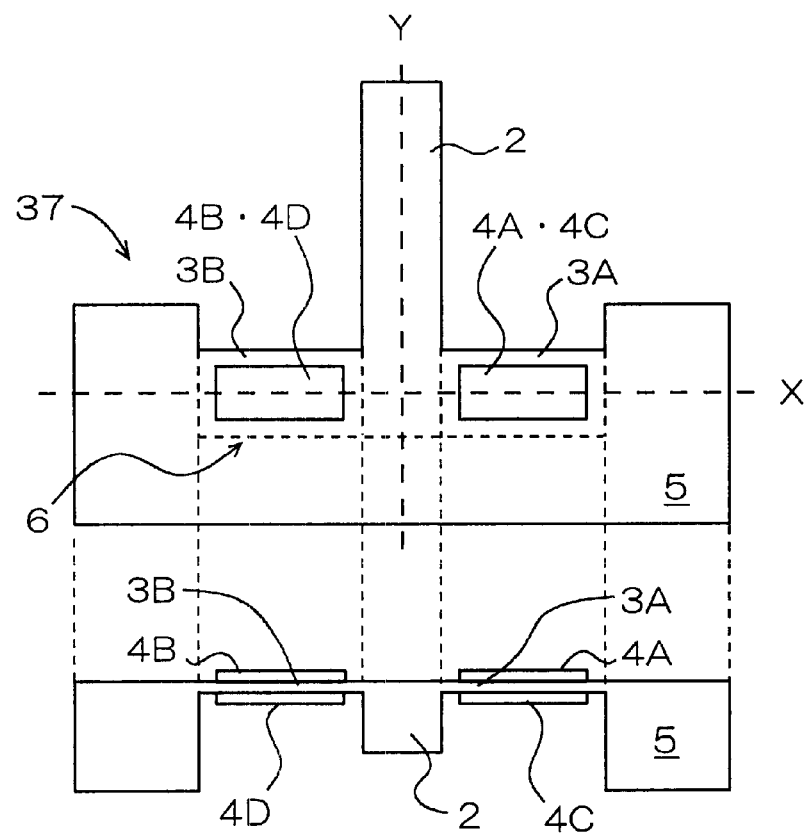
Fig.7A
Fig.7B

DISPLACEMENT CONTROL DEVICE AND ACTUATOR

BACKGROUND OF THE INVENTION

1. Field of the Invention

The present invention relates to a displacement control device which uses a piezoelectric/electrostrictive element to operate so that a portion describes a hysteresis displacement locus. The present invention further relates to an actuator using the same device, applicable properly to mechanisms for adjusting displacement, position and angle of various types of precision parts and others of optical equipment, precision equipment and other apparatus. The present invention is further employable for rotating motors, linear conveying apparatus, or the like.

2. Description of the Related Art

In recent years, in the fields of optics, magnetic recording, precision processing and others, a request for a displacement device or an actuator, capable of adjusting an optical path length or a position on the order of submicron, has come into existence. Additionally, fine machining techniques for micromachines have been actively studied, and power parts, such as motors, have become the center of wide interest in the medical field for local operation or the like.

Moreover, parts used in various types of electronic equipment have advanced rapidly in size and weight reduction, and conveying machines, parts feeders and others used for conveying or selecting such parts must also be suitable with respect to the configuration requirements to achieve high-accuracy.

So far, electromagnetic motors have come into widespread use as the foregoing actuator or the like. However, the control based upon the electromagnetic motor does not reach very high accuracy. For this reason, when employed in displacement control apparatus, in many cases, the electromagnetic motor takes charge of rough movement, whereas final fine movement (positioning) relies upon the use of a device equipped with another displacement mechanism. Further, the electromagnetic motor involves an undesirably large power consumption.

An example of a new technology related to the electromagnetic motor is an electrostatic type microactuator produced according to a Si or Ni micromachine process in Preliminary Reports "1997 International Conference on solid-state Sensors and Actuators" p1081–1084 of "TRANSDUCER '97." This offers micro-displacement by applying a voltage to and among a plurality of plate-like electrodes formed by a micromachining technique.

A problem arises with this actuator, however, in that difficulty in increasing the proper frequency because of its structure is experienced, so that the vibration is originally hard to attenuate at high-speed operation, which in turn increases the manufacturing cost for the micromachining process itself. With respect to a displacement control apparatus using such an actuator, further improvement in drive accuracy and in cost is desired.

SUMMARY OF THE INVENTION

Accordingly, the present invention has been developed in consideration of the foregoing problems associated with various types of actuators, and it is an object of the invention to provide a displacement control device capable of precise operation at high speed but at low power, and further, to provide an actuator having a plurality of identical displacement control devices.

For this purpose, in accordance with this invention, a displacement control device is provided, comprising a substrate, two diaphragms joined to at least side surfaces of a recess section made in the substrate, and a connecting plate put between the two diaphragms and joined to a bottom surface of the recess section, so that at least one end portion of each of the two diaphragms is joined to the connecting plate and an opposite end portion thereof is joined to the substrate. Further, at least two independent piezoelectric/electrostrictive elements are located at both the diaphragms to, and the connecting plate is driven to create a hysteresis displacement locus. In this case, it is preferable that this displacement control device has a construction in which a fixing plate is joined to one end of the connecting plate.

In addition, in accordance with this invention, a displacement control device is provided, comprising a substrate and two diaphragms joined to at least side surfaces of opposing recess sections made in the substrate. The displacement control device also includes a connecting plate having one end portion in a lengthwise direction sandwiched between at least the two diaphragms, and having another end portion in the lengthwise direction being sandwiched between at least two different diaphragms. The connecting plate is placed to span between bottom surfaces of the recess sections, so that at least one end portion of each of the four diaphragms is joined to the connecting plate and an opposite end portion thereof is joined to the substrate. The displacement control device further includes a fixing plate having a lengthwise direction parallel to the direction in which the said connecting plate is sandwiched between the diaphragms. At least two independent piezoelectric/electrostrictive elements are located proximate the two diaphragms between which the connecting plate is sandwiched, at one end portion of the connecting plate, such that the fixing plate is driven to create a hysteresis displacement locus.

In the displacement control device where the fixing plate is used as an indispensable component, it is preferable that a notch portion is made in a joined portion between the fixing plate and the connecting plate. Additionally, it is also preferable that the connecting plate is divided into at least two sections in the lengthwise direction of the fixing plate and the fixing plate is joined to the at-least-two connecting plate sections. Furthermore, it is also acceptable that a hinge section is set on the fixing plate to extend along the lengthwise direction of the fixing plate from the junction between the fixing plate and the connecting plate.

In each of the above-described displacement control devices, it is also preferable that the connecting plate and the diaphragms are formed to be joined to each other at their side surfaces, and that the connecting plate, the diaphragms and the substrate are integrated with each other. Naturally, in the case of the installation of the fixing plate, the fixing plate can also be integrated therewith. Such an integrated construction is producible using a green sheet laminating technique.

In the displacement control device according to this invention, in addition to the piezoelectric/electrostrictive elements for driving, one or more piezoelectric/electrostrictive elements to be employed as auxiliary elements are desired. This case does not require that the driving piezoelectric/electrostrictive elements are identical in type to the auxiliary elements. Additionally, if the piezoelectric/electrostrictive elements and electrode leads conducting to electrodes of the piezoelectric/electrostrictive elements are coated with an insulating layer made of a resin or a glass, the durability is desirably improved. In this case, preferably, the resin is a fluororesin or a silicone resin. Moreover, preferably, a shield layer made of an electrically conductive material is formed on the surface of the insulating layer, which contributes to the improvement and stability of the drive characteristics.

Suitable materials for the substrate, the connecting plate and the diaphragms, include fully stabilized zirconia or partially stabilized zirconia. Additionally, preferably, the configuration of any one of the fixing plate, the connecting plate and the diaphragms is trimmed by laser beam machining or mechanical machining for dimensional adjustment. Further, it is also preferred that the electrodes in the piezoelectric elements are processed by laser beam machining or mechanical machining to adjustment the available electrode area thereof Moreover, this invention provides an actuator using the foregoing displacement control device. That is, an actuator is provided having a plurality of displacement control devices each driven by two or more independent piezoelectric/electrostrictive elements so that a connecting plate or a fixing plate creates a hysteresis displacement locus. Preferably, the fixing plates are disposed so that their center lines run substantially parallel with each other, and/or the connecting plates are disposed so that their center lines run parallel with each other. Further, an actuator is provided having a plurality of displacement control devices located proximate the circumferential section of the connecting plate, and each is driven by two or more independent piezoelectric/electrostrictive elements so that the connecting plate or a fixing plate creates a hysteresis displacement locus.

In these cases, preferably, the plurality of displacement control devices are disposed so that the center lines of the fixing plates or the connecting plates intersect with each other and tip portions of the fixing plates or the connecting plates are directed to the intersection of the center lines of the fixing plates or the connecting plates.

BRIEF DESCRIPTION OF THE DRAWINGS

Other object and features of the present invention will become more readily apparent from the following detailed description of the preferred embodiments taken in conjunction with the accompanying drawings in which:

FIG. 1A is a plan view showing an embodiment of a displacement control device according to this invention;

FIG. 1B is a cross-sectional view showing the same as shown in FIG. 1A;

FIG. 2 is a perspective view showing an embodiment of a piezoelectric element to be set in a displacement control device according to this invention;

FIG. 6 is an illustrative view showing the transmission of a force to another object due to the drive of a displacement control device according to this invention;

FIG. 7A is a plan view showing another embodiment of a displacement control device according to this invention;

FIG. 7B is a cross-sectional view showing the same as shown in FIG. 7A;

DESCRIPTION OF THE PREFERRED EMBODIMENTS

Figure 3:
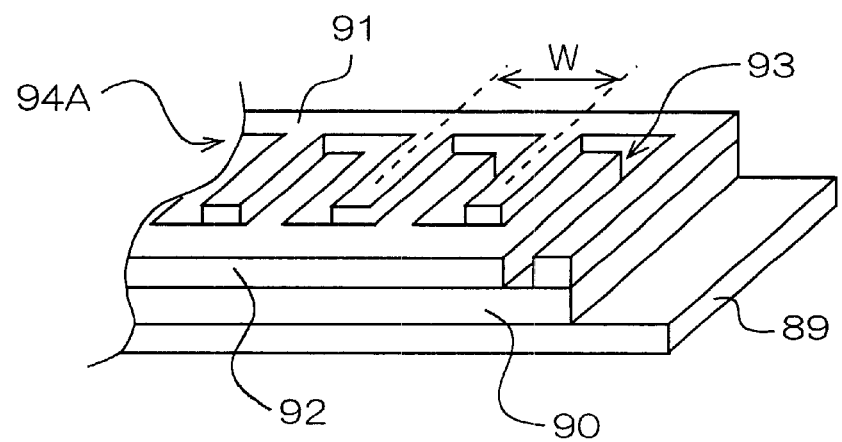
FIG. 3 is a perspective view showing another embodiment of the piezoelectric element to be set in a displacement control device according to this invention.

Referring to the drawings, a description is made hereinbelow of a displacement control device (hereinafter referred to as a device) according to the present invention, and of an actuator using this device. As will be obvious from the following description, the device according to this invention is made such that a connecting plate or a fixing plate constituting its component moves to create a hysteresis displacement locus owing to the drive of piezoelectric/electrostrictive elements, while the meaning of the term "hysteresis" will be mentioned herein later.

Additionally, an actuator according to this invention signifies a group of devices including a plurality of displacement control devices as components thereof. The actuator is not always limited to work on another object, and the present invention can include an actuator which itself moves or rotates.

FIG. 1A is a plan view showing a device 36, while FIG. 1B is a cross-sectional view showing a cross section including an X axis and perpendicular to the plan view (paper surface), hereinafter referred to as a cross-sectional view taken along an X axis. The device 36 has a structure in which a connecting plate 2 is interposed between two diaphragms 3A and 3B in an interposing direction referred to as an "X-axis direction," and the connecting plate 2 is joined onto a bottom surface of a recess section made in a substrate 5, while the diaphragms 3A and 3B are joined onto the side surface and bottom surface of the recess portion 6. In this case, preferably, the joining direction of the connecting plate 2 and the substrate 5 is perpendicular to the X axis, hereinafter referred to as a "Y-axis direction." Additionally, independent piezoelectric/electrostrictive elements 4A and 4B, hereinafter referred to as "piezoelectric elements," are placed on a main surface of diaphragms 3A and 3B, respectively.

In the device 36, it is necessary to join the diaphragms 3A and 3B to at least the side surfaces of the recess section 6, whereas they are not always required to be joined to the bottom surface of the recess section 6. That is, it is also possible that the diaphragms 3A and 3B are located between the connecting plate 2 and the side surfaces of the recess section 6.

In the piezoelectric elements 4A and 4B, although electrode leads from electrodes constituting the piezoelectric elements 4A and 4B are disposed toward the substrate 5, they are omitted from the illustrations of FIGS. 1A and 1B. Incidentally, the term "independent piezoelectric elements" signifies that the piezoelectric elements themselves are of a separate type, and further signifies that the piezoelectric elements can individually be driven independently of each other.

The joining of the connecting plate 2, the diaphragms 3 and the substrate 5 is made appropriately at their side surfaces, and preferably, they are integrated with each other. The use of the green sheet laminating method easily enables the integrated structure of the device 36. Although the connecting plate 2 is formed to have a larger thickness than the thickness of the diaphragms 3, it is also acceptable to have a thickness substantially equal to that of the diaphragms 3.

In this case, the term "connecting plate" means an element which propagates displacement or vibrations of a diaphragm arising with the drive of a piezoelectric element which enlarges or enhances the displacement of the diaphragm. A fixing plate can be joined to the tip portion of the connecting plate so that the configuration of the tip portion is taken optionally. That is, the connecting plate provides a connection between the fixing plate and the substrate for displacing or vibrating the fixing plate or the like. In the device 36, the connecting plate 2 itself can also function as a fixing plate.

The diaphragm is an element which converts the strain of a piezoelectric element located on a main plane (surface) into physical displacement or vibrations in a bending mode, and transfers the displacement or vibration to the connecting plate. Additionally, the diaphragm conversely propagates deformation from the displacement or vibration of the connecting plate, or a fixing plate joined to the connecting plate, to the piezoelectric element, or the like. The term "substrate" means an element for holding a moving portion, such as the connecting plate, the diaphragms, the piezoelectric elements, the fixing plate (if provided), or other components. Additionally, the substrate includes various types of electrode terminals for attachment to a drive or a measuring apparatus, and is used for handling during actual use.

As mentioned above, the substrate 5 has the recess section 6 made to hold the connecting plate 2 and the diaphragms 3A and 3B in the predetermined form shown in FIGS. 1A and 1B. The side surface(s) perpendicular to the X-axis, and the bottom surface perpendicular to the Y axis of the recess section 6 are not always required to be perpendicular to each other, and the intersection between the side surface and the bottom surface can have a curvature. It is also possible to make such a recess portion 6 by notching a portion of the outer circumferential side surface of the substrate 5, or by using three of four side surfaces, when a rectangular hole section is made in the interior of the substrate 5.

Accordingly, while the recess section 6 is not always required to be open in one of the Y-axis directions in which the connecting plate 2 protrudes, in this case, as mentioned later, the configuration of the recess section 6 is required to be set so as not to exert adverse influence on the displacement locus of the connecting plate 2 for use in the device 36.

Figure 4:
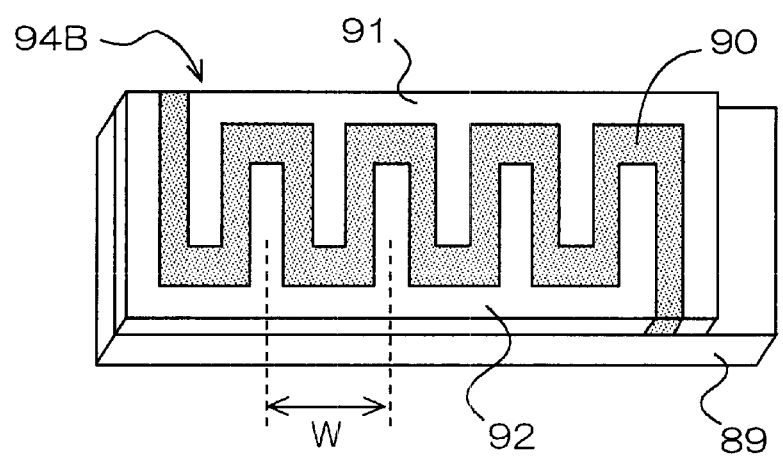
FIG. 4 is a perspective view showing a further embodiment of the piezoelectric element to be set in a displacement control device according to this invention.

The piezoelectric elements 4A and 4B shown in FIG. 2 represent a typical piezoelectric element 88 formed in a laminating process, such that piezoelectric film 86 is placed on a diaphragm 89 interposed between a first electrode 85 and a second electrode 87. It is also appropriate to use a piezoelectric element 94A, as shown in FIG. 3, having a comb-like configuration in which a piezoelectric film 90 is situated on an diaphragm 89, and a first electrode 91 and a second electrode 92 are placed on the piezoelectric film 90 to define a gap portion 93 having a constant width there between. Incidentally, in FIG. 3, the first electrode 91 and the second electrode 92 can also be formed between the diaphragm 89 and the piezoelectric film 90. Additionally, it is also appropriate to use a piezoelectric element 94B, as shown in FIG. 4, in which a piezoelectric film 90 is embedded between a first electrode 91 and a second electrode 92 having a comb-like configuration. In the case of the piezoelectric element 88, the transverse effect ($d_{31}$) of the electric field induced strain is taken properly, while in the piezoelectric elements 94A and 94B, the longitudinal effect ($d_{33}$) of the electric field inductive deformation is available appropriately.

With respect to piezoelectric elements 94A and 94B having comb-like electrodes as shown in FIGS. 3 and 4, if the pitch W of the comb-like electrode configuration is shortened, it is possible to increase the quantity of strain thereof. Such piezoelectric elements, shown in FIGS. 2 to 4, are applicable to all devices according to this invention which will be described herein later. Thus, when a voltage is applied to piezoelectric elements 4A and 4B, such as the piezoelectric element 88 for example, a strain corresponding to the applied voltage occurs in the piezoelectric film, and this strain propagates to the diaphragms 3 and then arrives at the connecting plate 2 so that a predetermined displacement takes place in the connecting plate 2.

Assuming that a piezoelectric element of a type using $d_{31}$ is placed as the piezoelectric elements 4A and 4B of the device 36, consideration is given to a process in which the connecting plate 2 is displaced due to the strain occurring in the piezoelectric elements 4A and 4B. Voltages to be applied to the piezoelectric elements 4A and 4B are taken as VA and VB, respectively, and the axis orthogonally crossed to both the X and Y-axes is referred to as a Z-axis.

Figure 5A:
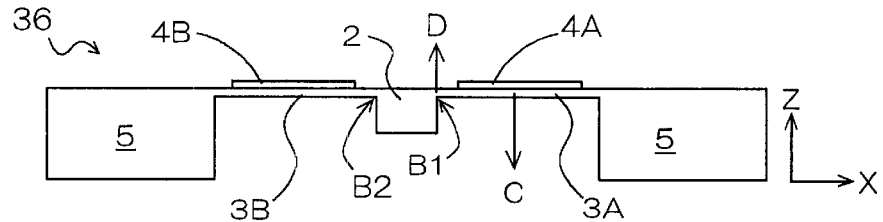
FIGS. 5A to 5D are illustrations useful for describing a drive mode of the displacement control device according to this invention.
Figure 5B:
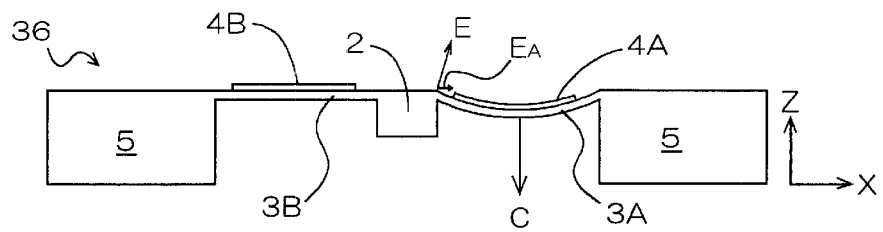
Figure 5C:
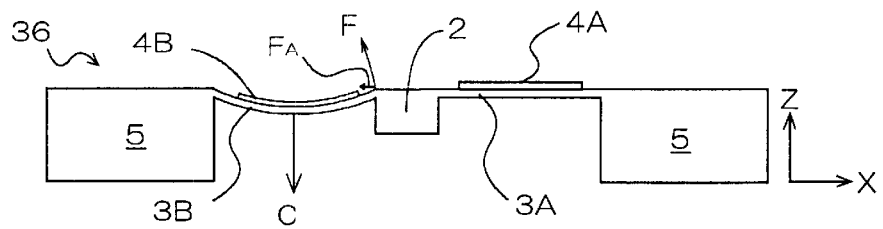
Figure 5D:
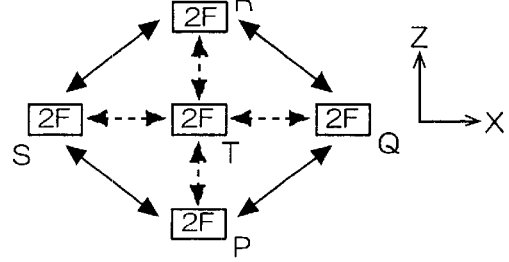

FIGS. 5A to 5C are cross-sectional views in a Z-X plane, corresponding to FIG. 1B, explaining the transition of the displacement of the connecting plate 2, and FIG. 5D shows the variation of the position of a tip surface 2F of the connecting plate 2 on the same Z-X plane. First, if the piezoelectric element 4B is not driven while a voltage is applied to only the piezoelectric element 4A, an electric field induced strain occurs in the piezoelectric film so that the piezoelectric element 4A contracts in the X-axis direction. Thus, as shown in FIG. 5A, a displacement in a curvature mode occurs in the Z-axis direction perpendicular to the main surface of the diaphragm 3A, as indicated by an arrow C. At this time, a force in a direction reverse to the arrow C acts on a joined portion B1 between the diaphragm 3A and the connecting plate 2 in a direction indicated by an arrow D. This arrow D direction corresponds to the Z-axis direction, and since the arrow D direction is perpendicular to the X-axis direction, the force does not contain a component which can displace the connecting plate 2 in the X-axis direction; therefore, at the moment of the voltage application, the connecting plate 2 is not displaced in the X-axis direction.

However, when a curvature occurs in the diaphragm 3A, the direction of the force acting on the joined portion B1 turns from the arrow D direction to a direction indicated by an arrow E as shown in FIG. 5B so that an X-axis component (arrow $E_A$) develops. Thus, it is considered that the connecting plate 2 is displaced in the X-axis direction (the right direction in the illustration). On the other hand, the three sides of the diaphragm 3A are joined to the substrate 5 and the connecting plate 2, but one side thereof forms a free end. Accordingly, as the curvature displacement of the diaphragm 3A increases, the free end of the diaphragm 3A displaces in the arrow D direction, namely in the Z-axis direction (upward direction in the illustration), and this displacement of the diaphragm 3A in the Z-axis direction causes the connecting plate 2 to displace in the Z-axis direction.

That is to say, when the position of the tip surface 2F of the connecting plate 2 in a state where no driving voltage is applied to the piezoelectric elements 4A and 4B is taken as P in FIG. 5D, with the drive of only the piezoelectric element 4A, the tip surface 2F of the connecting plate 2 displaces to shift from the P point to a Q point. Accordingly, at the Q point, the voltage applied to the piezoelectric element 4A is at VA while the voltage applied to the piezoelectric element 4B is at zero (0). Such a voltage application condition will be referred to hereinafter as "(VA·0)".

Contrary to the above description, when a voltage is only applied to the piezoelectric element 4B, as shown in FIG. 5C, a force indicated by an arrow F, working on a junction B2 between the connecting plate 2 and the diaphragm 3B acts in a direction symmetrical with respect to that of the force produced for when only the piezoelectric element 4A is driven (indicated by an arrow E). That is, with the drive of only the piezoelectric element 4B, as shown in FIG. 5D, the tip surface 2F of the connecting plate 2 displaces to shift from the P point to the S point. The voltage application state at this S point is expressed as (0·VB).

Accordingly, when a voltage is applied to the piezoelectric element 4B while the voltage application to the piezoelectric element 4A is maintained from the position in which the tip surface 2F of the connecting plate 2 is at the Q point, the displacement components in the X-axis directions are offset to decrease. However, since the displacement components in the Z-axis direction are superimposed on (added to) each other, the displacement in the X-axis direction becomes zero in the condition of the predetermined voltage (VA·VB), and the tip surface 2F of the connecting plate 2 becomes movable to the R point, where the largest displacement takes place in the Z-axis direction.

In this way, by changing the voltage application condition to the two independent piezoelectric elements 4A and 4B, the connecting plate 2 can be driven so that its tip surface 2F shifts along the route of P point→Q point→R point→S point→P point to create a hysteresis displacement locus, and naturally it can also be driven so that the tip surface 2F takes the route reverse thereto. Additionally, when the voltages to be applied to the piezoelectric elements 4A and 4B are taken as (VA/2·VB/2), it is possible to displace the connecting plate 2 to a T point. Accordingly, the connecting plate 2 can also be driven to take the route of P point→Q point→T point→S point→P point. In this case, between the Q point and the S point, a driving condition in which the displacement quantity in the Z-axis direction does not vary relatively takes place.

Consequently, in the structure in which the connecting plate 2 is interposed between the two diaphragms 3A and 3B, with the drive of at least the two independent piezoelectric elements 4A and 4B, the connecting plate 2 can be driven to draw a hysteresis displacement locus along an arbitrary route in the range surrounded by the P, Q, R and S points. Incidentally, in FIG. 5D, although the displacement locus between the P, Q, R, S and T points is shown linearly, it is possible to describe a curved or substantially circumferential locus by adjusting of the voltage applied to each of the piezoelectric elements 4A and 4B.

For example, as shown in FIG. 6, when an object 101 is put on an X-Y plane of the connecting plate 2, and the tip surface 2F of the connection plate 2 is driven to rotate counterclockwise, the object 101 is movable in the minus direction of the X axis (indicated by an arrow FF) by at least the friction between the connecting plate 2 and the object 101. The portion at which the connecting plate 2 comes into contact with the object 101 can take a circular cross section, in place of the rectangular cross section shown in FIG. 6. That is, the shape of the connecting plate 2 is not limited to a rectangular configuration. Although the above description relates to the case in which an element of a type utilizing $d_{31}$ is employed as the piezoelectric element, the connecting plate 2 can likewise be driven to describe a hysteresis displacement locus also in the case of an element of a type utilizing $d_{33}$.

Furthermore, in this invention, the term "hysteresis displacement locus" used as a displacement mode of the connecting plate 2 has the following meaning. In general, the term "hysteresis" signifies a phenomenon in which, when, in accordance with variation of one quantity A, another quantity B also varies, the quantity B varies with respect to the same quantity A depending upon the route of the variation of the quantity A. For example, if the quantity A is represented by the X-axis displacement position of the connecting plate 2, while the quantity B is represented with the Z-axis displacement position of the connecting plate 2, such that when a voltage is applied to the piezoelectric element 4A, varying in the range of 0 to VA, the relationship between the variation of the X-axis displacement position of the connecting plate 2 and the variation of the Z-axis displacement position thereof is commonly expressed by the route from the P point to the Q point in FIG. 5D. In this case, the Z-axis displacement position of the connecting plate 2 relative to the X-axis displacement position thereof is determined univocally.

On the other hand, in this invention, through the voltage application to the piezoelectric element 4B, the connecting plate 2 can be driven to take the route from the Q point to the R point. Accordingly, with respect to the X-axis displacement position of the same connecting plate 2, the Z-axis displacement position assumes different position, and the Z-axis displacement position relative to the X-axis displacement position is not determined univocally. The displacement route of the Q point→R point→S point→P point is one example of displacement route (locus) of this device, and in this invention, the term "hysteresis displacement locus" is used as such a displacement mode. Accordingly, in the reciprocating displacement (Z-axis direction oscillation) between the P point and the R point, the Z-axis displacement position of the connecting plate 2 assumes a plurality of values (multivalue) with respect to the X-axis displacement position thereof. This can also be included in the hysteresis displacement locus.

The voltage actually applied to the piezoelectric elements to achieve the foregoing hysteresis displacement locus must be appropriately adjusted based on the structure of the piezoelectric elements, the piezoelectric characteristic of the piezoelectric films, the difference in dimension between the piezoelectric elements in one device, and other factors for drawing a proper hysteresis displacement locus.

In the above-described device 36, since the connecting plate 2 is interposed between a plurality of diaphragms, the twisted displacement around the Y-axis is restrainable. Additionally, in this case, the displacement in the Z-axis direction is suppressible, while the displacement quantity in the X-axis direction increases. Still additionally, in the case in which the diaphragms 3A and 3B are not joined to the bottom surface of the recess section 6, twisted displacement around the Y-axis tends to occur, while a large displacement quantity in the Z-axis direction is possible. Moreover, as mentioned herein later, the configuration of the connecting plate 2 can also control the configuration of the hysteresis displacement locus. Thus, the configuration of the hysteresis displacement locus can be changed by controlling the voltage to be applied to the piezoelectric elements, as well as by controlling the structural design of the device itself.

Devices according to further embodiments can also be driven to create a hysteresis displacement locus as mentioned above with respect to device 36. A device 37, shown in the plan view of FIG. 7A and in the cross-sectional view FIG. 7B taken along an X axis in the plan view of FIG. 7A, employs a mode in which independent piezoelectric elements (4A, 4C) or (4B, 4D) are placed on both main surfaces of each of the diaphragms 3A and 3B used in the device 36. In this case, $d_{31}$ or $d_{33}$ type piezoelectric elements 4A to 4D, are properly selected and placed thereon. The piezoelectric elements 4A to 4D are driven according to the aforesaid drive principle shown in FIGS. 5A to 5D. For example, the piezoelectric element 4C utilizing $d_{33}$ is driven to further increase the deformation of the diaphragm 3A caused by the drive of the piezoelectric element 4A using $d_{31}$.

On the other hand, it is possible that the piezoelectric elements 4A and 4B are used as driving elements while the piezoelectric elements 4C and 4D are used as auxiliary elements for each device 36 or 37. The auxiliary elements signify a fault diagnosing element, a displacement confirming/deciding element, a drive auxiliary element or the like, and the use of the auxiliary elements enables high-accuracy drive of the connecting plates. It is also preferable to place a plurality of auxiliary elements different in application from each other.

Figure 8:
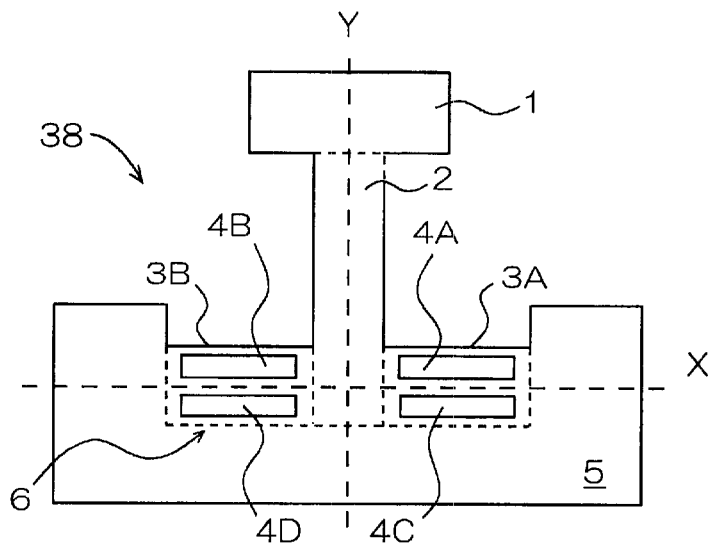
FIG. 8 is a plan view, showing a further embodiment of a displacement control device according to this invention.

A plan view of FIG. 8 shows a device 38 in which a fixing plate 1 is joined to the tip portion of the connecting plate 2 used in the device 36. In this case, the fixing plate 1 serves as an element for additionally increasing the displacement of the connecting plate 2 by a predetermined quantity. For example, in a case in which an object which is hard to bring into contact with a bar-like member, such as the connecting plate 2 illustrated, is moved, the fixing plate 1 is designed to the configuration or the like of that object.

Figures 9A, 9B:
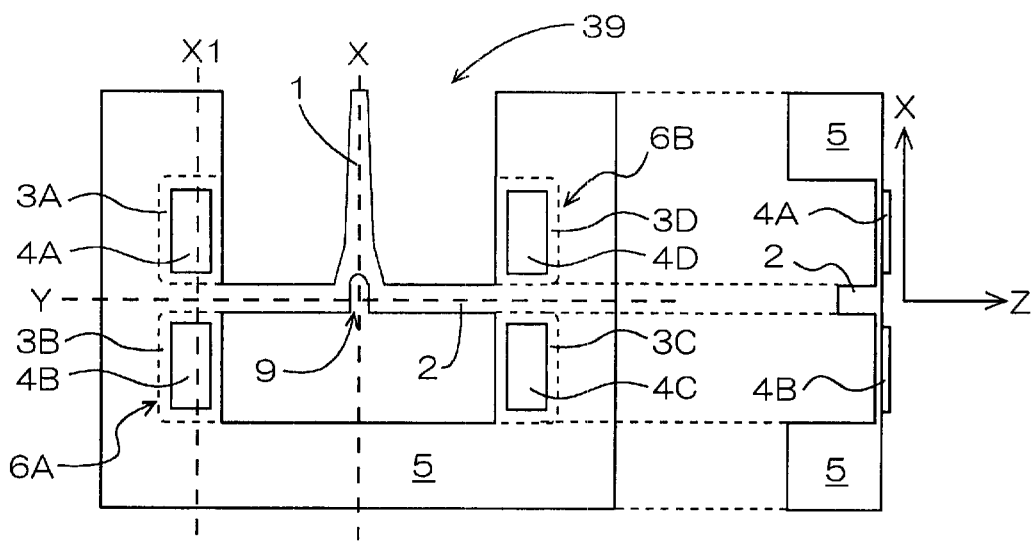
FIG. 9A is a plan view showing a further embodiment of a displacement control device according to this invention.
FIG. 9B is a cross-sectional view showing the same as shown in FIG. 9A.

In the device 38, two independent piezoelectric elements 4A and 4C, separated in the Y-axis direction, are formed on one main surface of one diaphragm 3A, while similar piezoelectric elements 4B and 4D are also set on the other diaphragm 3B. In this case, preferably, the piezoelectric elements 4A and 4B closer to the fixing plate 1 are used as driving elements while the piezoelectric elements 4C and 4D on the bottom surface side of the recess section 6 are used as auxiliary elements. For all the devices according to this invention, the division of the piezoelectric elements can be achieved by providing the piezoelectric elements 4A and 4B and then dividing them by the laser beam machining, or by providing the piezoelectric elements 4A to 4D as a set of two elements in the first place. Furthermore, FIG. 9A is a plan view showing a device 39, and FIG. 9B is a crosssectional view taken along an X1 axis in the plan view. The device 39 has a construction in which a connecting plate 2 whose one end portion in its longitudinal direction (Y-axis direction) is interposed between diaphragms 3A and 3B, and whose other end portion is interposed between two different diaphragms 3C and 3D extending between bottom surfaces of recess sections 6A and 6B in a substrate 5 and opposed to each other. The diaphragms 3A to 3D are joined to the bottom surfaces and side surfaces of the recess sections 6A and 6B, and the fixing plate 1 is joined to the connecting plate 2 so that the longitudinal direction of the fixing plate 1 is parallel with the X-axis direction of the interposition of the connecting plate 2 by the diaphragms 3A, 3B, 3C and 3D.

Furthermore, while independent piezoelectric elements 4A to 4D are respectively provided on one main surface of each diaphragm 3A to 3D, it is also possible that the piezoelectric elements are located on both the main surfaces of the diaphragms 3A to 3D. Additionally, it is also possible that the piezoelectric elements 4A and 4B are provided on only the diaphragms 3A and 3B which accept one end portion of the connecting plate 2 there between. However, this device is inferior in the displacement enlargement efficiency as compared with the mode in which four independent piezoelectric elements 4A to 4D for driving are respectively provided on the diaphragms 3A to 3D.

It is also appropriate that two sets of two diaphragms having flat surfaces facing each other are used instead of the diaphragms 3A and 3B, such that four diaphragms accept the connecting plate there between. This can also apply to diaphragms 3C and 3D. The location of the piezoelectric elements 4A and 4B and the piezoelectric elements 4C and 4D in the device 39 is similar to that of the piezoelectric elements 4A and 4B in the aforesaid device 36, and preferably, in the device 39, all the piezoelectric elements 4A to 4D are made with an element of a type using $d_{31}$ or $d_{33}$.

For example, when a piezoelectric element using $d_{31}$ is used as the piezoelectric elements 4A to 4D, first, a voltage is applied to the piezoelectric elements 4A and 4C. Since the force by which the piezoelectric element 4A displaces the connecting plate 2 in the X-axis direction and the force by which the piezoelectric element 4C displaces the connecting plate 2 in the X-axis direction are reverse to each other, a force occurs at the joined portion between the fixing plate 1 and the connecting plate 2, which rotates the connecting plate 2 around the vicinity of the intersection of the X axis and the Y axis in the X-Y plane. This force causes the fixing plate 1 to shift so that the tip portion of the fixing plate 1 is driven in the Y-axis direction centering around the vicinity of the intersection between the X-axis and the Y-axis.

In this manner, the device 39 has a two-step displacement enlarging mechanism whereby the deflection displacement of the piezoelectric elements 4A and 4C causes the deflection displacement of the connecting plate 2 in the X-axis direction, and the deflection displacement of the connecting plate 2 is converted into the rotational displacement of the fixing plate 1 in the Y-axis direction. At this time, enlarged displacement is achievable by the design of the length of the fixing plate 1 in the X-axis direction. Additionally, the displacement of the connecting plate 2 arising in the Z-axis direction is also transmitted to the fixing plate 1.

Likewise, when a voltage is applied to the piezoelectric elements 4B and 4D, the displacement occurs in the reverse direction as compared with the drive of the piezoelectric elements 4A and 4C although similarly in the Y-axis directions. In this way, the piezoelectric elements 4A and 4B in the device 39 are driven so that the connecting plate 2 creates a hysteresis displacement locus. A voltage application condition is set to piezoelectric elements 4A and 4C at the same time as a voltage application condition is set to piezoelectric elements 4B and 4D, whereupon movement of the tip surface of the fixing plate 1 is expressed on the Y-Z plane, and the fixing plate 1 can be driven to create a hysteresis displacement locus similar to that shown in FIG. 5D.

A notch portion 9 made in the junction between the connecting plate 2 and the fixing plate 1 in the device 39 plays a role in effectively developing the aforesaid enlargement conversion of the X-axis direction displacement of the connecting plate 2 into the Y-axis direction displacement of the fixing plate 1. Preferably, the notch portion 9 is made having a length (depth) in the Z-axis direction that reaches the interior of the fixing plate 1. It is also preferable to shorten the width of a notch portion 11, corresponding to the length of the notch portion 9 in the Y-axis direction.

Figure 10:
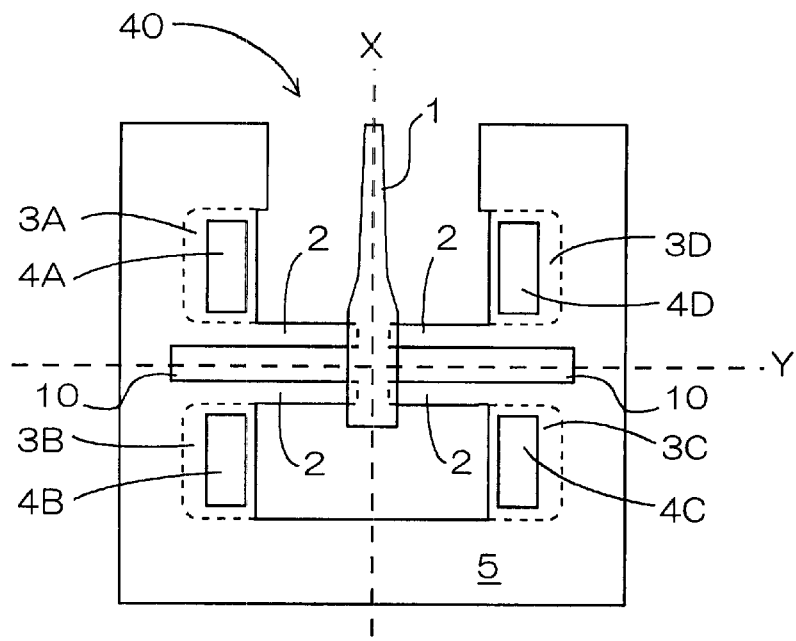
FIG. 10 is a plan view showing a further embodiment of a displacement control device according to this invention.

Furthermore, a device 40 shown in FIG. 10 has a structure in which a connecting plate 2 is divided in two along a longitudinal direction of a fixing plate 1 (X-axis direction), and each of the divided connecting plates 2 is further divided in two along an spanning direction of the connecting plate 2 (Y-axis direction). Thus, as a result, the fixing plate 1 is joined to one side of a main surface of four connecting plates 2 located transversely there through. In this case, the connecting plates 2 and the fixing plate 1 are joined integrally with each other. Additionally, connecting plate 2 can be divided into three or more sections. The division of the connecting plate in the longitudinal direction (X-axis direction) of the fixing plate can create a gap between the divided sections so that the width of the connecting plate of the divided sections in the X-axis direction decreases. Further, a plurality of connecting plates can be arranged in a row with each other such that a gap is interposed there between in the X-axis direction and such that the X-axis direction width of the connecting plates does not vary.

Since the device 40 employs a mode in which each of the piezoelectric elements 4A to 4D drives the corresponding connecting plate 2 through the corresponding one of the diaphragms 3A to 3D, a plurality of points (junctions) at which the deformation of the piezoelectric elements 4A to 4D act on the fixing plate 1 are given so that the fixing plate 1 can effectively be driven in the same driving manner as that for the device 39.

Incidentally, in a gap portion 10 between the connecting plates 2, it is also acceptable that a plate-like member whose thickness is smaller than that of the connecting plates 2 is located to extend between the connecting plates 2 in the X-axis direction. Although the relative displacement of the fixing plate 1 decreases, the rigidity increases so that the fixing plate 1 is movable at a higher response velocity. Additionally, the gap portion 10 is not always required to be formed throughout the overall length in the Y-axis direction of the connecting plate 2. The effects are attainable, even over a partial range.

Figure 11:
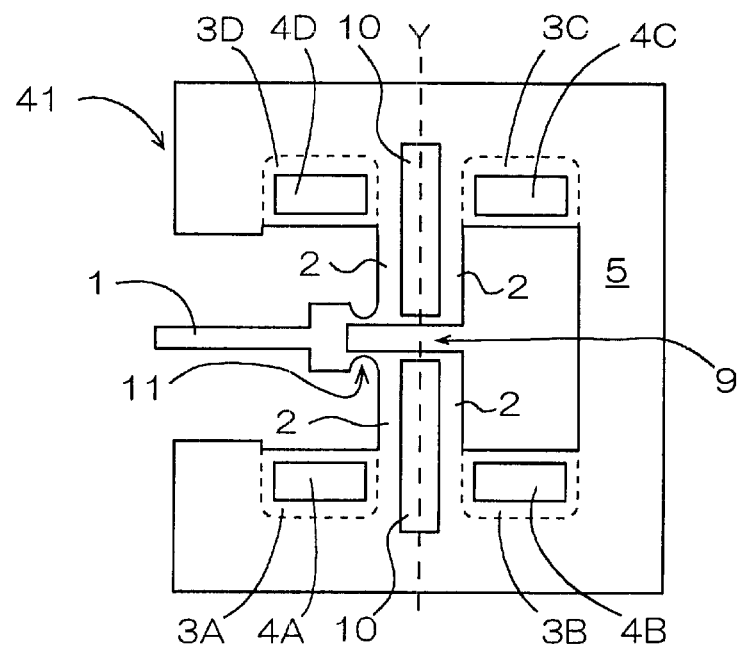
FIG. 11 is a plan view showing a further embodiment of a displacement control device according to this invention.

FIG. 11 is a plan view showing a device 41 in which a fixing plate 1 is joined integrally to two divided connecting plates 2 in the longitudinal direction thereof. A hinge section 11 is made in the fixing plate 1 along the longitudinal direction thereof from the joined portion between the fixing plate 1 and the connecting plate 2, and a notch portion 9 is made in the junction between the fixing plate 1 and the connecting plates 2. The hinge section 11 assists the displacement drive of the tip portion of the fixing plate 1 in the Y-axis direction, and a large displacement is obtainable more effectively due to the additional formation of the notch portion 9. Such a hinge section 11 can also be included in the foregoing devices 39 and 40.

Figure 12A:
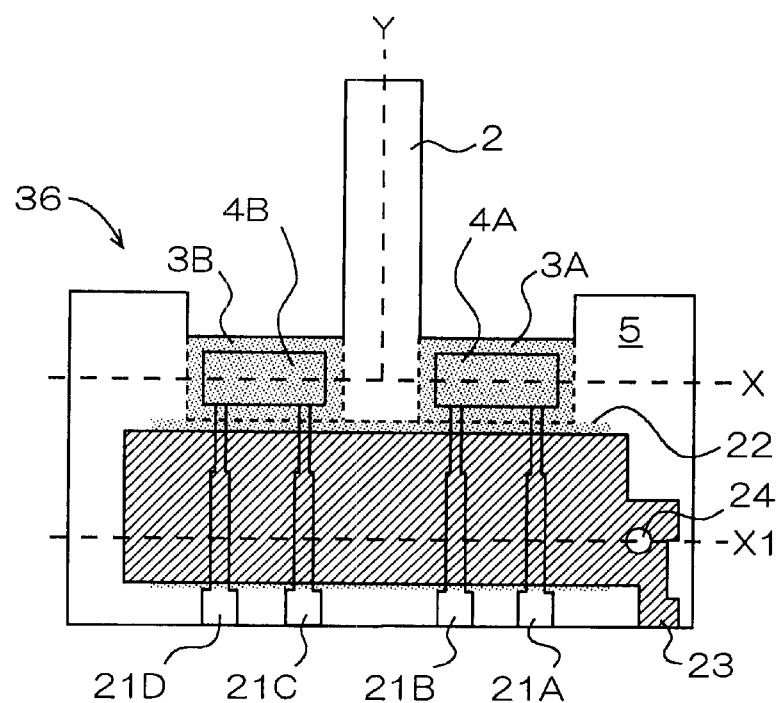
FIG. 12A is a plan view showing a protective mode of electrodes and others of a displacement control device according to this invention.
Figure 12B:
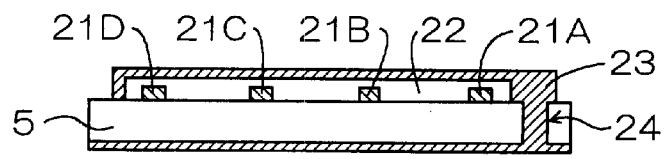
FIGS. 12B to 12D are cross-sectional views showing the same as shown in FIG. 12A.
Figure 12C:
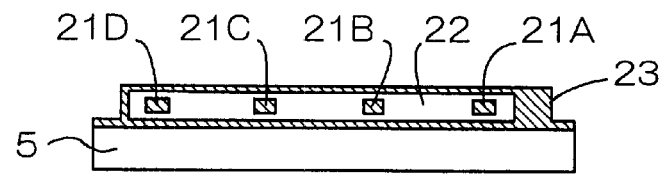
Figure 12D:
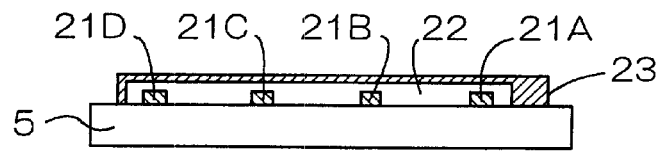

The description hereinbelow relates to the formation of electrode leads from piezoelectric elements, for example, in the above-described device 36. FIG. 12A is a plan view showing a mode in which electrode leads 21A to 21D are set to piezoelectric elements 4A and 4B installed in the device 36, and an insulating layer 22 is placed on the piezoelectric elements 4A and 4B and the electrode leads 21A to 21D and then covered with a shield layer 23. FIGS. 12B to 12D are cross-sectional views taken along an X1 axis in FIG. 12A, illustrating different modes.

The insulating layer 22 effectively improves the environmental resistance characteristics of the piezoelectric elements 4A and 4B. The shield layer 23, intercepts external electromagnetic waves to excellently secure the displacement accuracy when the device is driven at a high frequency, and further prevents malfunction and noise introduction.

As modes of the installation of the shield layer 23, the shield layer 23 can cover a substrate 5 as shown in FIG. 12B, the shield layer 23 can cover only the wiring section on the substrate 5 as shown in FIG. 12C, or the shield layer 23 is placed on only one side, i.e., the upper side, of the wiring section as shown in FIG. 12D. Shielding the entire wiring section, as shown in FIGS. 12B and 12C, is desirable. While the connection between portions of the shield layer 23 formed on the surfaces of the substrate 5 is made through the use of a through hole 24 made in the substrate 5, in FIG. 12A, it is also possible that this connection is made through a side surface of the substrate 5. A detailed description of suitable materials for insulating layer 22 and the shield layer 23 are later included herein.

The substrate, the fixing plate, the connecting plate and the diaphragms may be made of an insulating material or a dielectric material capable of being formed integrally with the piezoelectric elements without using an adhesive. For example, suitable ceramic materials include fully stabilized zirconia, partial stabilized zirconia, alumina, magnesium and others, and as non-oxide, there are listed silicon nitride and others. Of these, fully stabilized zirconia and partially stabilized zirconia are preferable, since high mechanical strength, even in the form of a sheet, high toughness, and low reactivity with piezoelectric films and electrode materials are characteristic of these materials. When fully stabilized zirconia and partially stabilized zirconia are employed as the material for these plates, at least for the diaphragms, it is preferable that they contain an additive such as alumina or titania. Ceramics are preferable for securing the reliability of the joining portion and simplifying the manufacturing process, since the device can be formed integrally using a green sheet laminating technique.

In the device according to this invention, as mentioned above, while no limitation is imposed on the thickness and configuration of the fixing plate which can be designed properly according to its service, the thickness of the substrate can be properly determined in consideration of the operational performance, and the shape thereof is not always required to be plate-like. On the other hand, it is preferable that the thickness of the diaphragm is approximately 3 to 20 μm, and that the total thickness of the diaphragm and the piezoelectric element is approximately 15 to 60 μm. Furthermore, the connecting plate preferably has a thickness of 20 to 600 μm, and a width of 30 to 500 μm, wherein the aspect ratio (the width (length in the X-axis direction)/the length in the thickness direction (Z-axis direction)) of the connecting plate is preferably in the range of 0.1 to 15, and more preferably with in the range of 0.1 to 7.

As the piezoelectric film of the piezoelectric elements, a piezoelectric ceramic is preferable, but it is also possible to use electrostrictive ceramics, ferroelectric ceramics or antiferroelectric ceramics. Additionally, materials which require polarization treatment, as well as materials which do not, are employable. However, for use in a magnetic recording head or the like, since the linearity between the displacement of the fixing plate and the driving voltage or the output voltage is important, a material showing a small deformation hysteresis is preferable. Accordingly, a material whose coercive electric field is below 10 kV/mm is preferable.

Suitable piezoelectric ceramics include lead zirconate, lead titanate, lead magnesium-niobate, lead nickel-niobate, lead zinc-niobate, lead manganese-niobate, lead antimony stannate, lead manganese-tungstic acid, lead cobalt niobate, lead magnesium tantalate, barium titanate, and others, including a mixture of some of these components. Of these, this invention uses a material containing lead zirconate, lead titanate and lead magnesium niobate as a main component, because this material has a high electromechanical coupling factor, a high piezoelectric constant, shows a low reactivity with the plate (ceramic substrate) upon sintering of the piezoelectric film, and even allows a stable formation having a predetermined composition.

In addition to the aforesaid piezoelectric ceramic, it is also possible to use ceramics properly containing an oxide as an additive, such as lanthanum, calcium, strontium, molybdenum, tungsten, barium, niobium, zinc, nickel, manganese, cerium, cadmium, chrome, cobalt, antimony, iron, yttrium, tantalum, lithium, bismuth or tin, a combination of some of these, or other compounds. For example, it is also preferable that lead zirconate, lead titanate and lead magnesium niobate are used as a main component, and that lanthanum or strontium is included therein for adjusting the coercive electric field or the piezoelectric characteristics.

On the other hand, it is preferable that the electrode of the piezoelectric element is made of a metal which is a solid at room temperature and which has an excellent conductivity. For example, a single metal such as aluminum, titanium, chrome, iron, cobalt, nickel, copper, zinc, niobium, molybdenum, ruthenium, palladium, rhodium, silver, tin, tantalum, tungsten, iridium, platinum, gold or lead, or an alloy comprising some of these can be used. It is also possible to use a cermet material in which the same material as that of the piezoelectric film or the diaphragm is dispersed therein.

The selection of the material for the electrode of the piezoelectric element is determined depending upon the method of forming the piezoelectric film. For example, where a first electrode is formed on a diaphragm and a piezoelectric film is then formed on the first electrode by sintering, the first electrode is preferably a high melting point metal, such as platinum, which does not change at the sintering temperature of the piezoelectric film. However, a second electrode formed on the piezoelectric film after the sintering formation thereof, can be a low melting point metal, such as aluminum.

In addition, the piezoelectric element can be made integrally at one time by sintering, but in this case, both the first and second electrodes must be a high melting point metal which can withstand the piezoelectric film sintering temperature. On the other hand, in the case of forming the first and second electrodes 91 and 92 on the piezoelectric film 90 like the piezoelectric element 94A shown in FIG. 3, it is possible to use the same low melting point metal for both. Thus, the first electrode and the second electrode can be selected properly in consideration of the piezoelectric film forming temperature represented by the piezoelectric film sintering temperature. The electrode leads can be formed simultaneously with the electrodes. The electrode leads on the diaphragm are formed simultaneously with the piezoelectric element, and the electrode leads on the substrate can then be formed through the use of various methods such as sputtering and screen-printing.

Furthermore, an insulating glass or resin can be used as the material of the insulating layer formed on the piezoelectric element and the electrode leads to prevent deterioration of the displacement and to enhance the performance of the device. However, it is preferable to use resin rather than glass. A proper resin is a fluorocarbon polymer (resin) showing an excellent chemical stability, examples of which include, terafluoroethylene based Teflon (Teflon PTFE produced by Du Pont Co., Ltd.), terafluoroethylene-hexafluoropropylene copolymer based Teflon (Teflon FEP), terafluoroethylene-perfluoroalkylvinylrther copolymer based Teflon (Teflon PFA), and PTFE/PFA composite Teflon.

Furthermore, although silicon resin is somewhat inferior to fluorocarbon polymers with respect to corrosion resistance and weather resistance, a thermosetting silicone resin is also a suitable material. In addition, an epoxy resin, an acrylic resin or the like may be used. To establish an insulating layer, different materials are used for the piezoelectric element and the peripheral portion thereof, and for the electrode lead and the peripheral portion thereof, respectively. Preferably, an inorganic/organic filler is added into the insulating resin to adjust the rigidity of the diaphragm and other components.

Desirable materials for the shield layer include various kinds of metals, such as gold, silver, copper, nickel, aluminum and others. In addition, all the metallic materials for the aforesaid electrode in the piezoelectric element are also employable. Additionally, an electrically conductive paste produced by mixing a metal powder with a resin is also employable therefor.

The description given hereinbelow relates to a method of producing a device according to this invention, taking the forgoing device 39 for instance. The plurality of members including the connecting plate, the fixing plate and other components, the device according to this invention can also be formed separately and joined together. However, in this case, productivity is lower and breakage easily occurs at the joints, which creates a problem in reliability. For these reasons, this invention employs a more suitable production method, namely, green sheet laminating using a ceramic powder as the raw material.

Figure 13:
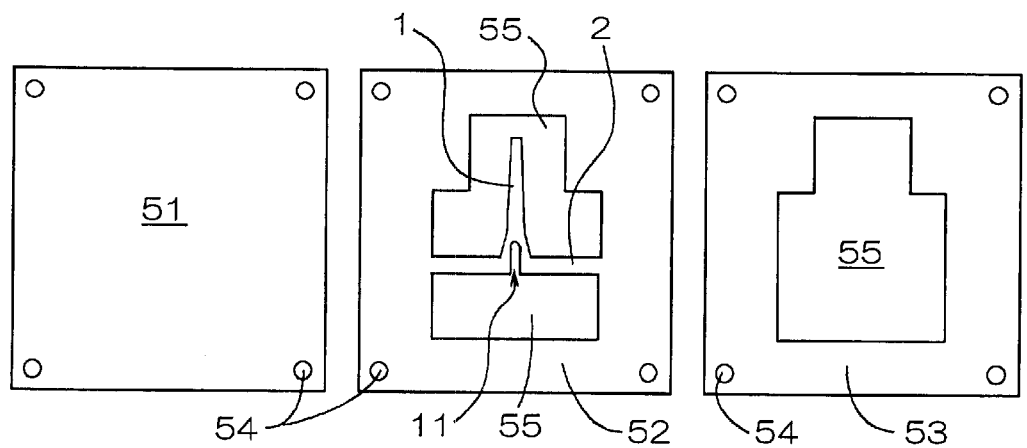
FIG. 13 is a plan view showing an example of configuration of a sheet member for use in manufacturing a displacement control device according to this invention.

In the green sheet laminating technique, a binder, a solvent, a dispersant, and others are mixedly introduced into a ceramic powder such as zirconia, to produce a slurry. Subsequently, after degassing this slurry, a green sheet or a green tape, having a predetermined thickness, is produced by a method using a reverse-roll coater or doctor blade. Following this, the various green sheet members (hereinafter referred to as sheet members) shown in FIG. 13 are produced by punching the green sheet using a die.

A sheet member 51 is formed into the substrate 5, the connecting plate 2, the fixing plate 1 and the diaphragms 3A to 3D, and after sintering forms one plate whose configuration is indefinite. This is because, as mentioned above, it is preferred that the diaphragms 3A to 3D range from 3 to 20 $\mu$m and it is preferable to cut off unnecessary portions therefrom by laser machining to maintain the desired configurational accuracy. A sheet member 52 is provided to form the substrate 5, the fixing plate 1, and the connecting plate 2, so that they have a thickness larger than that of the diaphragms 3A to 3D. The sheet member 52 includes a reference hole 54, window sections 55, the fixing plate 1 and the connecting plate 2. At the junction between the fixing plate 1 and the connecting plate 2, the formation of the notch portion 11 is possible. The desired thicknesses of the fixing plate 1 and the connecting plate 2 are obtainable by laminating a predetermined number of multiple sheet members corresponding to sheet member 52. When the fixing plate 1 is formed to have a smaller thickness than that of the connecting plate 2, only the fixing plate 1 portion is removed from the sheet member 52, and a plurality of such sheet members are laminated. A sheet member 53 having a reference hole 54 and a window section 55 is used to form the substrate 5. The desired thickness thereof is also achievable by laminating a predetermined number of sheets corresponding to sheet member 53.

These sheet members 51 to 53 are positioned using the reference holes 54, and then integrated with each other by the thermo compression bonding, thereby creating a laminated member. Thereafter, the laminated member is sintered at a temperature of 1200° C. to 1600° C. Preferably, the piezoelectric elements 4A to 4D are formed in advance at the final position with respect to diaphragms 3A to 3D in the sheet member 51, and co-fired integrally with the laminated member.

In this case, the piezoelectric films are formed according to the press formation method using a mold, or by tape formation using a raw material slurry The piezoelectric films are then laminated on the sheet member 51 by thermo compression bonding, and then sintered simultaneously to concurrently produce the substrate and the piezoelectric films. However, in this case, electrodes must be formed on the substrate or the piezoelectric films in advance using the film formation method later described herein.

While the sintering temperature for the piezoelectric films is determined according to the specific material thereof, it is commonly 800° C. to 1400° C., and preferably 1000° C. to 1400° C. To control-the composition of the piezoelectric film upon sintering, it is preferable that the atmosphere is adjusted to account for evaporation of the piezoelectric material. It is particularly preferable that the aforesaid atmosphere adjustment to relieve sintering stress in the piezoelectric film is controlled by observing the piezoelectric film after the sintering and monitoring the distribution of the components.

For example, when a material containing lead zirconate, lead titanate and lead magnesium niobate is used as a main component of the piezoelectric ceramic, preferably the atmosphere adjustment upon sintering is made so that the zirconium is segregated in the calcined piezoelectric film. More preferably, the atmosphere is adjusted so that the segregation of the zirconium component is concentrated in the vicinity of the surface and hardly occurs in the interior of the piezoelectric film. As compared with a piezoelectric film having no segregation, a piezoelectric film having such a component distribution has superior vibration characteristics, showing a large vibration amplitude. Further, the original characteristics of the piezoelectric power are not reduced because the sintering stress is relieved by the segregation of the zirconium component.

Accordingly, in the device according to this invention, most preferably, the piezoelectric element is made from such a piezoelectric film. In addition to producing the aforesaid piezoelectric film composition, it is also preferable that the sintering atmosphere is controlled such that a component of the piezoelectric material, particularly titanium oxide for a piezoelectric material containing titanium oxide, is contained in the parts of the device, such as the connecting plate and the substrate after sintering. Furthermore, when the piezoelectric film and the substrate are sintered simultaneously, both sintering conditions must match.

Moreover, piezoelectric elements can be formed as diaphragms in the laminated member after sintering using thick-film formation methods, such as screen printing, dipping, coating, electrophoresis, or various thin-film formation methods, such as ion beam, sputtering, vacuum deposition, ion plating, chemical vapor deposition (CVD) and plating. Of these, this invention preferably employs screen printing, dipping, coating and/or electrophoresis, because these methods use a paste, slurry, suspension, emulsion, or sol comprised mainly of piezoelectric ceramic particles or powder having an average particle size of 0.01 to 5 $\mu$m, preferably 0.05 to 3 $\mu$m, and provide excellent piezoelectric operation characteristics. In addition, the electrophoresis method enables film formation at a high density and at a high configurational accuracy, and further mentions the feature stated in the technical document "DENKI KAGAKU", 53, No. 1 (1985) P63–68, written by Kazuo Anzai.

For example, after a laminated member produced is sintered under a predetermined condition, a first electrode is printed and sintered at a predetermined position on a surface of the sintered sheet member 51, a piezoelectric film is then printed and sintered, and then a second electrode is printed and fired, thereby locating the piezoelectric element. Subsequently, electrode leads for connecting the electrodes of the piezoelectric element to a measuring device are printed and fired. When, for example, platinum (Pt) is used as the first electrode, lead zirconate-titanate (PZT) is used as the piezoelectric film, gold (Au) is used as the second electrode and silver (Ag) is used as the electrode leads, since the sintering or firing temperature is set to decrease sequentially in the firing process, re-sintering of the material fired at a higher firing stage does not occur, thus preventing problems such as peeling or aggregation.

Incidentally, the proper selection of materials enables sequential printing of the parts of the piezoelectric elements and the electrode leads thereof to achieve integral firing at one time. Also, it is possible to form the electrodes at a low temperature after the formation of the piezoelectric films. Additionally, it is also acceptable to form the parts of the piezoelectric element and the electrode leads thereof through the use of a thin-film formation method, such as sputtering or deposition. In this case, heat treatment is not always necessary.

With the piezoelectric element being thus constructed according to the film formation method, it is possible to integrally join and situate the piezoelectric elements and the diaphragms without using an adhesive, thereby facilitating integration and securing reliability and reproducibility. In this case, it is possible that the piezoelectric film is shaped into an appropriate pattern using formation methods such as screen printing, photolithography, laser beam machining, or mechanical machining methods such as slicing and ultrasonic machining.

In this way, the diaphragms, the fixing plate and the notch portion, if needed, are made at predetermined positions of the sintered laminated member in which the piezoelectric elements and the electrode leads are provided. In this case, it is preferable to cut and remove unnecessary portions of the sintered sheet member 51 using the fourth harmonic of a YAG laser. Thus, the device 39 comprising the diaphragms 3A to 3D, the fixing plate 1, and the connecting plate 2 having the configuration shown in FIG. 9 is obtainable. Incidentally, it is also possible that the unnecessary portion corresponding to substrate 5 is removed by laser beam machining or dicing. In addition, it is preferable to adjust the configurations of the fixing plate 1 and the connecting plate 2 formed principally by the sheet member 52, or the configurations of the diaphragms 3A to 3D formed by the sheet member 51, by such machining to reduce the difference among the configurations, or to adjust the displacement quantity or driving characteristics.

Figure 14:
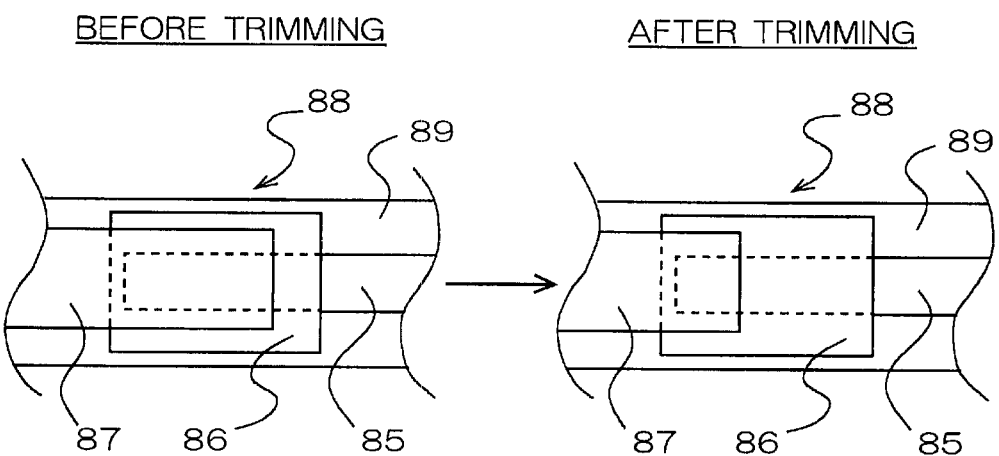
FIG. 14 is an illustration useful for explaining one example of a piezoelectric element processing method for a displacement control device according to this invention.

Preferably, in the piezoelectric element 88 shown in FIG. 2, as shown in FIG. 14, the second electrode 87 is used as an upper electrode while the first electrode 85 is taken as a lower electrode and the piezoelectric element 88 having the piezoelectric film 86 is placed there between. The upper electrode is then mechanically trimmed by the fourth harmonic of a YAG laser to adjust the effective electrode area of the piezoelectric element, thereby adjusting the electrical characteristics of the device, such as the impedance, to provide predetermined displacement characteristics. When the structure of the piezoelectric element 88 is a comb-like structure shown in FIG. 3 or 4, a portion of one or both of the electrodes may be trimmed. In addition to the aforesaid YAG fourth harmonic laser, laser beam machining by a YAG laser, the second harmonic or third harmonic of a YAG laser, an eximer laser, a $CO_2$ laser, and further electron beam machining, dicing (mechanical processing) like are employable to control the size and shape of the device.

Furthermore, in addition to the manufacturing method using the aforesaid green sheets, the device according to this invention can also be formed by pressing, or casting using a mold, injection molding, or the like. Mechanical machining, such as cutting, grinding, laser beam machining, punching, or ultrasonic machining can be used to achieve a predetermined configuration before or after the sintering.

The insulating layer formed on the piezoelectric elements 4A to 4D and the electrode leads in the device 39 is manufactured in this way using a glass or a resin by screen printing, coating, spraying, or the like. When glass is used, the temperature of the device itself must be increased to approximately the softening temperature of the glass, and since the hardness is high, there is a possibility of hindering the displacement or the vibration. On the other hand, because resin is soft, simple processing such as drying will do, and therefore, using resin is preferable. Preferably, when the resin used for the insulating layer is a fluorocarbon polymer or a silicone resin, to improve adhesion with the ceramic substrate, a primer layer is preferably formed according to the kind of resin and ceramic used, and the insulating layer is formed there between.

When resin is used for the insulating layer, heat-treatment becomes difficult if various metallic materials are put to use, so a method such as sputtering, which does not require heating, is preferably employed to form the shield layer on the insulating layer. On the other hand, when an electrically conductive paste comprising a metal powder and a resin are used, screen-printing, coating or the like can be used in an appropriate manner. Incidentally, when glass is used as the insulating layer, a conductor paste can be screen-printed and fired at a temperature below that which causes the glass to flow.

Figure 15:
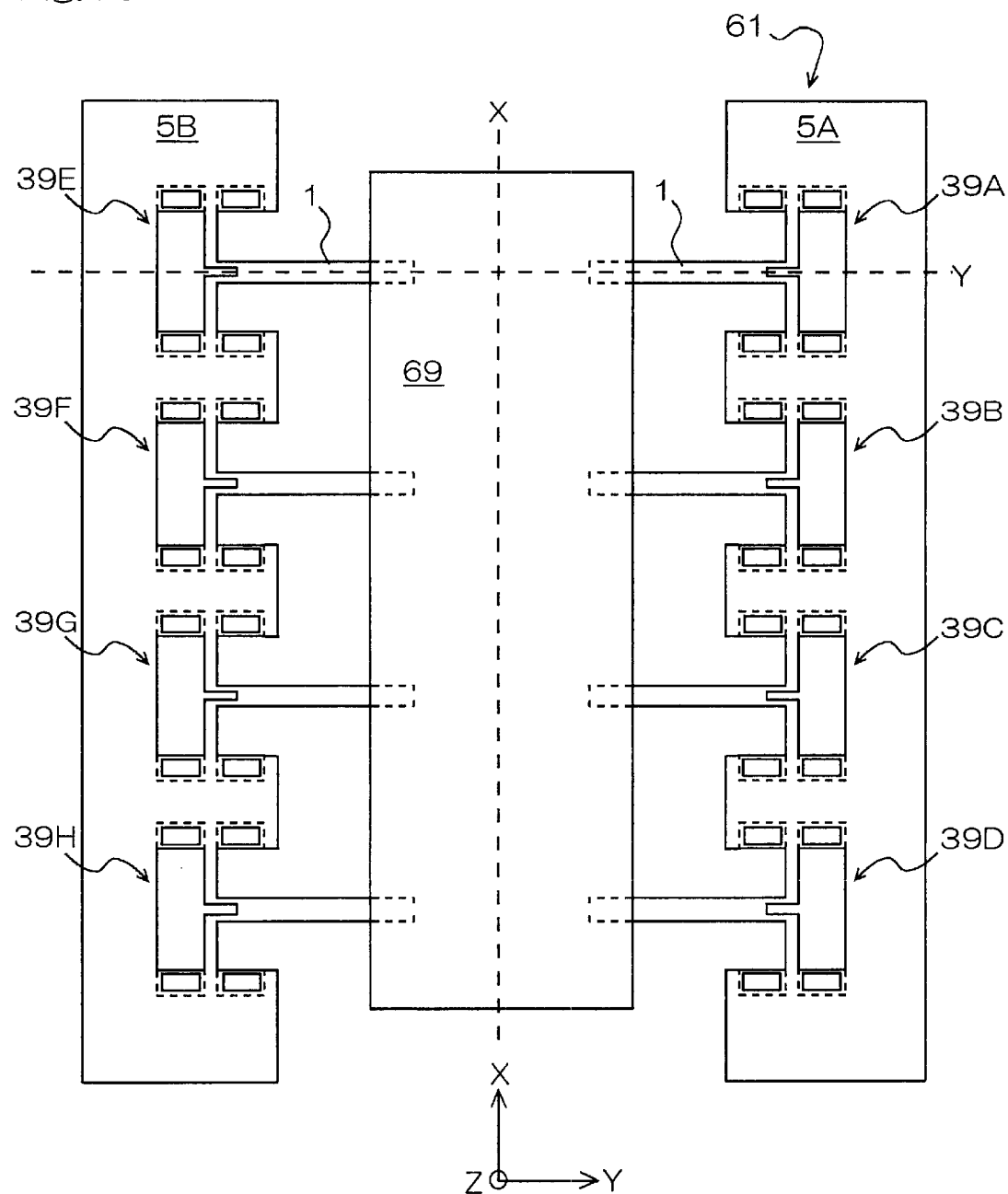
FIG. 15 is a plan view showing an embodiment of an actuator using a displacement control device according to this invention.

In addition to the foregoing embodiments, the present invention further provides actuators using the foregoing various devices. In the structure of an actuator 61 shown in the plan view of FIG. 15, a plurality (eight in total in the case of FIG. 15) of devices 39 are provided such that the center lines (Y axes) of the fixing plates 1 are substantially parallel with each other, and the X-Y planes of the fixing plates 1 are in the same plane in the stationary condition. In addition, an object 69 to be carried is placed to contact the end portions of the respective fixing plates 1.

In the actuator 61, when the devices such as 39A and 39E are located symmetrically with respect to the Z-X plane, and driven so that the tip portions of the fixing plates 1 create symmetrical hysteresis displacement loca with respect to the Z-X plane, a force of moving in the X-axis direction acts on the carried object 69. In this case, the direction of the hysteresis displacement locus depends upon the X-axis direction in which the object 69 is moved. The devices 39B to 39D are driven to create a hysteresis displacement locus similar to that of the device 39A, while the devices 39F to 39H are drive to draw a hysteresis displacement locus similar to that of the device 39E, and the actuator 61 serves as a linear motor, a conveyer or the like.

Figure 16A:
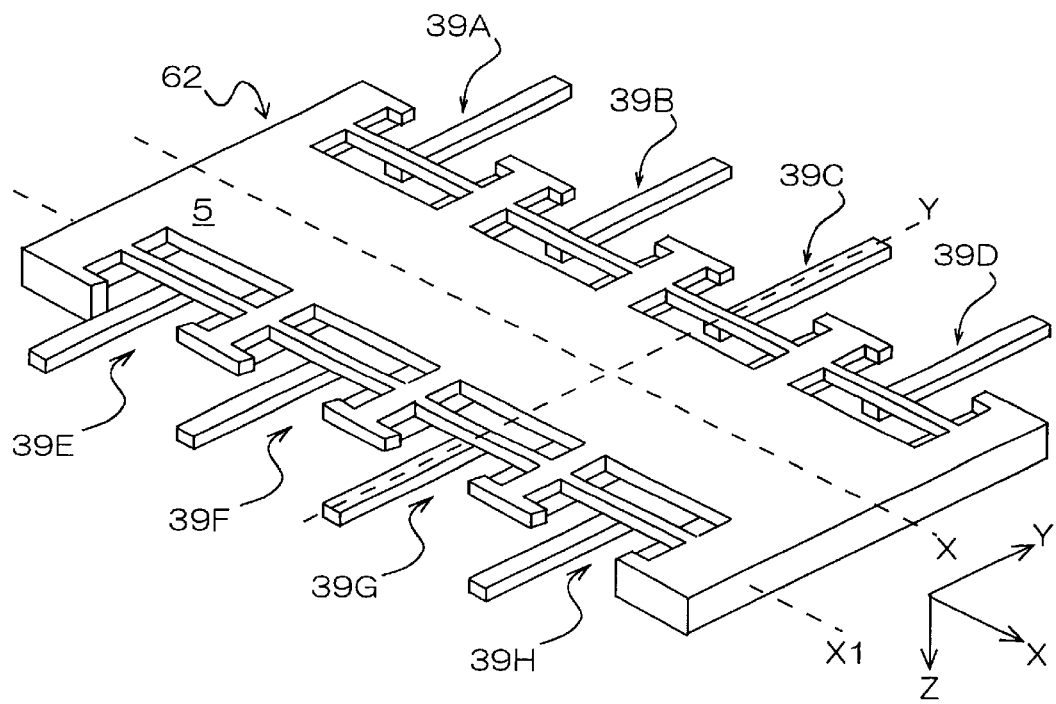
FIG. 16A is a perspective view showing another embodiment of an actuator using a displacement control device according to this invention.
Figure 16B:
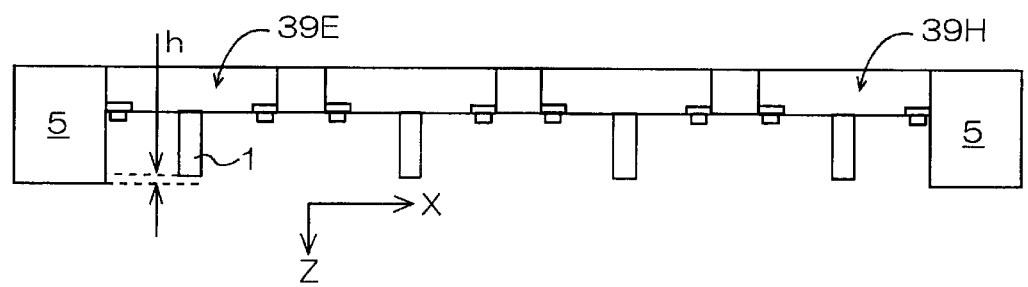
FIG. 16B is a cross-sectional view showing the same as shown 3in FIG. 16A.

The devices 39A to 39D are formed integrally on a substrate 5A, while the devices 39E to 39H are formed integrally on a substrate SB. An actuator having such a structure is formed easily using the above-mentioned green sheet laminating method, but it is also possible that the devices 39A to 39H are manufactured separately and placed at predetermined position to thus construct the actuator 61. Naturally, the devices constituting the actuator 61 are not limited to the device 39. FIGS. 16A and 16B show an actuator 62 in which eight devices 39A to 39H are positioned on one substrate 5 so that the tip portions of the fixing plates 1 are situated toward the outside of the substrate 5, and the center lines (Y axes) of the fixing plates 1 are in parallel relation to each other. FIG. 16A is a perspective view, and FIG. 16B is a cross-sectional view taken along a line AA in the perspective view in a Z-X plane.

As with the aforesaid actuator 61, when the devices 39A to 39H are driven, the actuator 62 can move linearly by itself. As shown in FIG. 16B, when the actuator 62 is in the stationary condition, the substrate reaches the ground plane while the respective fixing plates 1 are separated therefrom. When this difference, h, in height there between is set below the displacement quantity of the fixing plates 1 in the Z-axis direction, the height difference, h, functions as a clutch. That is, when the displacement quantity of the fixing plates 1 in the Z-axis direction exceeds the height difference, h, the actuator 62 can itself move, and when the displacement quantity of the fixing plates 1 in the Z-axis direction is below the height difference, h, the actuator 62 itself cannot move.

Figure 17A:
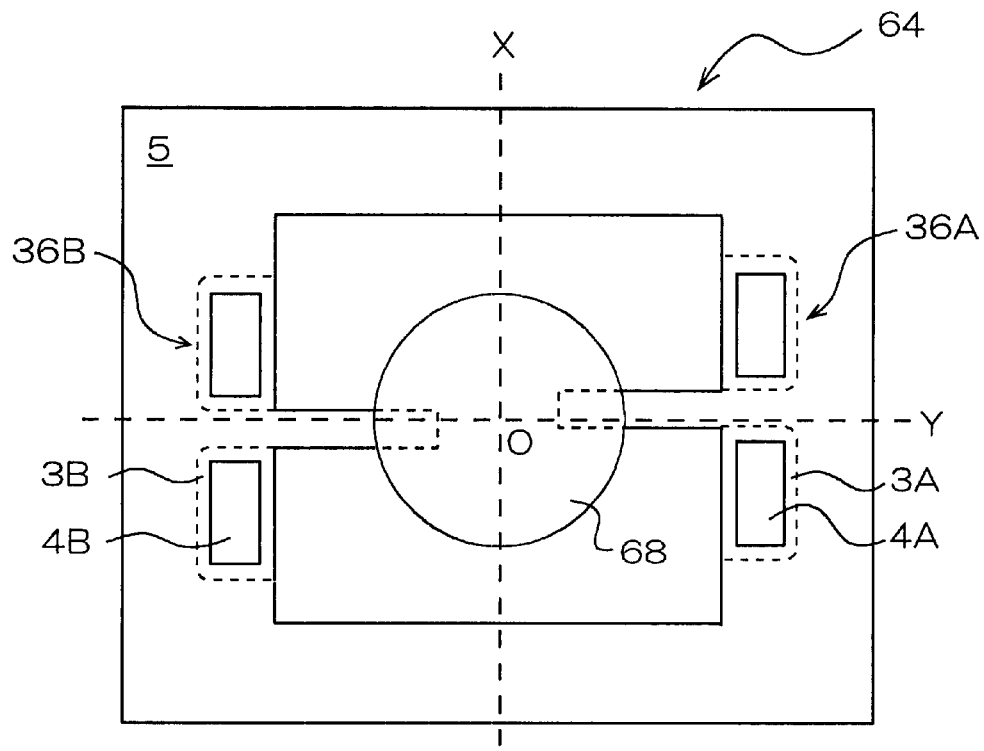
FIG. 17A is a plan view showing a further embodiment of an actuator using a displacement control device according to this invention.
Figure 17B:
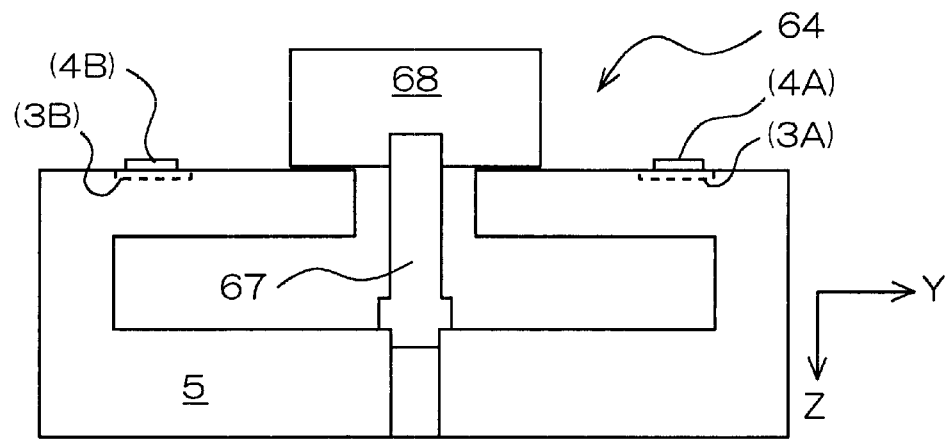
FIG. 17B is a cross-sectional view showing the same as shown in FIG. 17A.

FIG. 17A is a plan view showing an actuator 64 using two devices 36 (devices 36A and 36B) as shown in FIG. 1, and FIG. 17B is a cross-sectional view taken along the Y axis in FIG. 17A. In FIG. 17B, in order to make clear the positions of the diaphragms 3A and 3B and the piezoelectric elements 4A and 4B in the devices 36A and 36B, the positions of these parts which do not exist on the Y-axis are shown additionally.

In FIGS. 17A and 17B, an X-Y-Z orthogonal coordinate is set for each of the devices 36A and 36B as illustrated, and the intersection of these axes is set as the origin O. At this time, the actuator 64 has a structure in which the devices 36A and 36B are located at the positions organizing point symmetry with respect to the origin O. Additionally, a rotor 68, whose rotating center is determined by a shaft 67, is placed at the central portion of the actuator 64 to contact each of the fixing plates 1 of the devices 36A and 36B. In this case, the rotating center of the shaft 67 coincides with the center of the point symmetry (the origin O) of the actuator 64.

When a predetermined signal (voltage) is applied to each of the devices 36A and 36B, the connecting plate 2 of each of the devices 36A and 36B reciprocates between the P point and the R point shown in FIG. 5D. That is, when the connecting plate 2 of each device takes the displacing motion in the Z-axis directions, the actuator serves as a motor for rotating the rotor 68 in a constant direction. At this time, the contact between the connecting plate 2 and the rotor 68 is made at a predetermined angle so that the rotation takes place in the constant direction. Additionally, in FIGS. 17A and 17B, although the actuator is provided with a set of devices lying at the point symmetry positions, another set of devices existing at the point symmetry positions is preferably provided, so that the contacting angle between the rotor 68 and the connecting plates 2 assumes positive and negative values in both the sets, and the rotating movement thereof in two directions becomes possible.

On the other hand, when the devices 36A and 36B are driven so that the connecting plate 2 does not take the aforesaid Z-axis direction displacement mode, but rather describes the rotating locus of P point→Q point→R point→S point→P point as shown in FIG. 5D, rotational motion of the rotor 68 is achieved. In this case, the direct rotational motion of the connecting plate 2 can be transferred to the rotor 68, and high-torque, high-speed rotation becomes feasible, but, due to the change of the driving signal, one set of devices preferably sets up the rotation in both the directions.

Figure 18A:
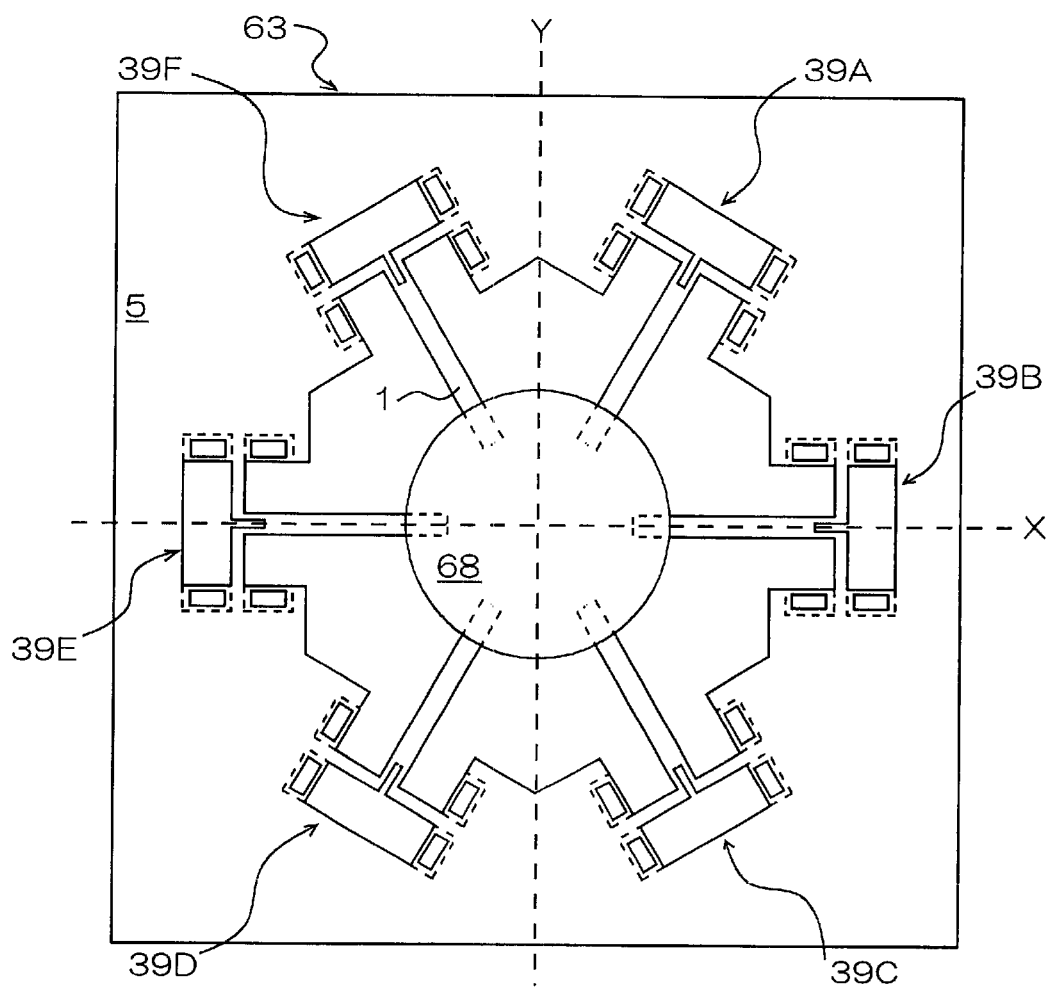
FIG. 18A is a plan view showing a further embodiment of an actuator using a displacement control device according to this invention.
Figure 18B:
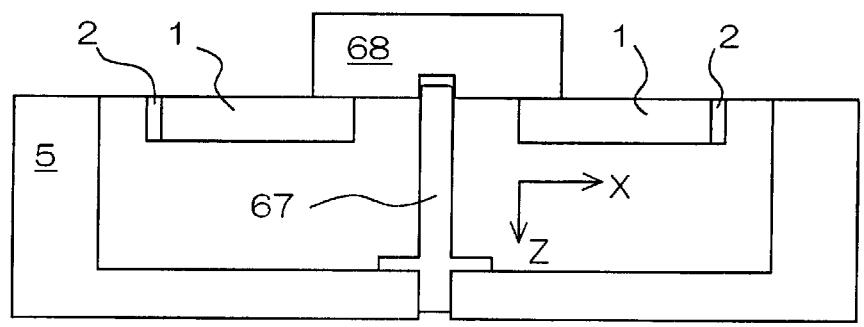
FIG. 18B is a cross-sectional view showing the same as shown in FIG. 18A.

FIG. 18A is a plan view showing an actuator 63, in which the devices 39 are disposed circumferentially, and FIG. 18B is a cross-sectional view taken along the X-axis in the plan view. In the actuator 63, the X axis and the Y axis are not set on each of devices 39A to 39F, but X, Y and Z axes are defined on the actuator 63 per se as shown in FIG. 18A.

In the actuator 63, the devices 39A to 39F are disposed so that the center lines, indicative of the longitudinal direction, of the fixing plates 1 intersect with each other, and the tip portions of the fixing plates 1 are directed to the intersection of the center lines (the intersection of the X axis and the Y axis). Additionally, a rotor 68, whose center of rotation is defined by a shaft 67, is placed at the central portion of the actuator 62 to contact the fixing plates 1.

It is possible to set up a rotating motion of the rotor 68 by driving each of the devices 39A to 39F such that a hysteresis takes place, causing a force from each of the fixing plates 1 to act on the rotor 68 in one direction. Additionally, if the direction of the fixing plate 1 hysteresis is reversed, high-speed reversal of the rotating direction is easily possible, and thus, the actuator 63 can properly be used as a motor.

Incidentally, compared to the foregoing actuator 64, the actuator 63 can take more drive portions, thereby accomplishing a higher torque, and driving the rotor 68 by displacement in the Z-axis directions is also possible.

If, for example, a disc-like substrate is put to use, and the devices 39 are provided on the disc-like substrate so that the center lines of the fixing plates intersect with each other, and the tip portions of the fixing plates protrude outwardly and radially from the disc-like substrate, then it is possible to provide a self-rotated type actuator. Preferably, a shaft is provided on the disc-like substrate to define the center of rotation. Although methods of applying a voltage to the piezoelectric elements render it difficult to use such a self-rotated actuator as a rotating motor, it is sufficiently employable as an actuator for controlling microscopic angular displacement.

The operating speed of the actuators according to this invention, as well as the operational performance (including inaction and reverse), can be easily selected by controlling the frequency and voltage applied to the piezoelectric elements.

While the embodiments of the displacement control devices and the actuators using these displacement control devices according to this invention have been described above in detail, it should be understood that this invention is not limited to these embodiments, and that it is intended to cover all changes and modifications of the embodiments of the invention by those skilled in the art, which do not constitute departures from the spirit and scope of the invention.

Each of the displacement control devices according to this invention is characterized in that its structure is simple, the size and weight reduction is easy, a high displacement efficiency is obtainable at saved power and it is independent of the harmful vibrations or the like from the external. Accordingly, it is possible to use the displacement control device itself as a sensor or an actuator. Additionally, an actuator comprising a plurality of displacement control devices can be used as a linear motor, a rotating motor, a position control actuator and others which are excellent in braking characteristic. Further, using the green sheet laminating method, which is a simple and easy manufacturing method which takes a wide design tolerance, the reliability is improvable by the employment of the integrated structure, and production is possible at a low cost. Moreover, the tolerance on the selection of the component materials is wide, and suitable materials can be used according to the object on all such occasions.

What is claimed is:

1. A displacement control device comprising:
   a substrate;
   two diaphragms joined to at least side surfaces of a recess section made in said substrate;
   at least one piezoelectric/electrostrictive element disposed on each of said diaphragms independent from one another; and
   a connecting plate sandwiched between said two diaphragms and joined to a bottom surface of said recess section, so that at least one end portion of each of said two diaphragms is joined to said connecting plate and an opposite end portion thereof is joined to said substrate,
   wherein said connecting plate is driven by said piezoelectric/electrostrictive elements to create a hysteresis displacement locus.

2. A displacement control device according to claim 1, wherein a fixing plate is joined to one end portion of said connecting plate.

3. A displacement control device comprising:

a substrate;

two diaphragms joined to at least side surfaces of recess sections made in said substrate, said recess sections being in opposed relation to each other;

at least one piezoelectric/electrostrictive element disposed on each of said diaphragms independent from one another;

a connecting plate whose one end portion, in a lengthwise direction, is sandwiched between at least said, two diaphragms, and whose other end portion, in the lengthwise direction, is sandwiched between at least two different diaphragms, said connecting plate being placed to span between bottom surfaces of said recess sections, so that at least one end portion of each of said four diaphragms is joined to the connecting plate and an opposite end portion thereof is joined to said substrate; and a fixing plate, wherein a lengthwise direction of said fixing plate is parallel with a direction in which said connecting plate is sandwiched between said diaphragms;

wherein said fixing plate is driven by said piezoelectric/electrostrictive elements to create a hysteresis displacement locus.

4. A displacement control device according to claim 3, wherein a notch portion is made in a joined portion between said fixing plate and said connecting plate.

5. A displacement control device according to claim 3, wherein said connecting plate is divided into at least two sections in said lengthwise direction of said fixing plate and said fixing plate is joined to said at-least-two connecting plate sections.

6. A displacement control device according to claim 4, wherein a hinge section is set on said fixing plate to extend along said lengthwise direction of said fixing plate from said junction between said fixing plate and said connecting plate.

7. A displacement control device according to claim 1, wherein at least said connecting plate and said diaphragms are joined to each other at their side surfaces.

8. A displacement control device according to claim 3, wherein at least said connecting plate and said diaphragms are joined to each other at their side surfaces.

9. A displacement control device according to claim 7, wherein at least said connecting plate, said diaphragms and said substrate are formed integrally with each other.

10. A displacement control device according to claim 8, wherein at least said connecting plate, said diaphragms and said substrate are formed integrally with each other.

11. A displacement control device according to claim 9, wherein at least said connecting plate, said diaphragms and said substrate are produced through the use of a green sheet laminating technique.

12. A displacement control device according to claim 10, wherein at least said connecting plate, said diaphragms and said substrate are produced through the use of a green sheet laminating technique.

13. A displacement control device according to claim 1, wherein, in addition to said piezoelectric/electrostrictive elements for driving, one or more piezoelectric/electrostrictive elements are put to use as auxiliary elements.

14. A displacement control device according to claim 3, wherein, in addition to said piezoelectric/electrostrictive elements for driving, one or more piezoelectric/electrostrictive elements are put to use as auxiliary elements.

15. A displacement control device according to claim 1, wherein said piezoelectric/electrostrictive elements and electrode leads conducting to electrodes of said piezoelectric/electrostrictive elements are coated with an insulating layer made of one of a resin or a glass.

16. A displacement control device according to claim 3, wherein said piezoelectric/electrostrictive elements and electrode leads conducting to electrodes of said piezoelectric/electrostrictive elements are coated with an insulating layer made of one of a resin or a glass.

17. A displacement control device according to claim 15, wherein said resin is one of a fluorocarbon polymer or a silicone resin.

18. A displacement control device according to claim 16, wherein said resin is one of a fluorocarbon polymer or a silicone resin.

19. A displacement control device according to claim 15, wherein a shield layer made of an electrically conductive material is formed on a surface of said insulating layer.

20. A displacement control device according to claim 16, wherein a shield layer made of an electrically conductive material is formed on a surface of said insulating layer.

21. A displacement control device according to claim 1, wherein at least said substrate, said connecting plate and said diaphragms are made of one of a fully stabilized zirconia and a partially stabilized zirconia.

22. A displacement control device according to claim 3, wherein at least said substrate, said connecting plate and said diaphragms are made of one of a fully stabilized zirconia and a partially stabilized zirconia.

23. A displacement control device according to claim 1, wherein a configuration of any one of said fixing plate, said connecting plate and said diaphragms is trimmed by one of laser beam machining and mechanical machining for dimensional adjustment.

24. A displacement control device according to claim 3, wherein a configuration of any one of said fixing plate, said connecting plate and said diaphragms is trimmed by one of laser beam machining and mechanical machining for dimensional adjustment.

25. A displacement control device according to claim 1, wherein electrodes in said piezoelectric elements are processed by laser beam machining or mechanical machining for adjustment of an available electrode area of said piezoelectric elements.

26. A displacement control device according to claim 3, wherein electrodes in said piezoelectric elements are processed by laser beam machining or mechanical machining for adjustment of an available electrode area of said piezoelectric elements.

27. An actuator including a plurality of displacement control devices, each comprising:

a substrate;

two diaphragms joined to at least side surfaces of a recess section made in said substrate;

at least one piezoelectric/electrostrictive element disposed on each of said diaphragms independent from one another; and a connecting plate sandwiched between said two diaphragms and joined to a bottom surface of said recess section, so that at least one end portion of each of said two diaphragms is joined to said connecting plate and an opposite end portion thereof is joined to said substrate;

wherein said connecting plate of each of said plurality of displacement control devices is driven by said piezoelectric/electrostrictive elements to create a hysteresis displacement locus, and wherein said connecting plates are disposed so that their center lines run substantially parallel with each other.

28. An actuator including a plurality of displacement control devices arranged circumferentially around a recess formed in a substrate, each of said displacement control devices comprising:

a substrate;

two diaphragms joined to at least side surfaces of said recess in said substrate;

at least one piezoelectric/electrostrictive element disposed on each of said diaphragms independent from one another; and a connecting plate sandwiched between said two diaphragms and joined to a bottom surface of said recess, so that at least one end portion of each of said two diaphragms is joined to said connecting plate and an opposite end portion thereof is joined to said substrate;

wherein said connecting plate of each of said plurality of displacement control devices is driven by said piezoelectric/electrostrictive elements to create a hysteresis displacement locus.

29. An actuator according to claim 28, wherein said plurality of displacement devices are disposed so that center lines of said fixing plates or said connecting plates intersect with each other and tip portions of said fixing plates or said connecting plates are directed to the intersection of said center lines of said fixing plates or said connecting plates.

30. An actuator including a plurality of displacement control devices, each comprising:

a substrate;

two diaphragms joined to at least side surfaces of recess sections made in said substrate, said recess sections being in opposed relation to each other;

at least one piezoelectric/electrostrictive element disposed on each of said diaphragms independent from one another;

a connecting plate whose:one end portion, in a lengthwise direction, is sandwiched between at least said two diaphragms, and whose other end portion, in the lengthwise direction, is sandwiched between at least two different diaphragms, said connecting plate being placed to span between bottom surfaces of said recess sections, so that at least one end portion of each of said four diaphragms is joined to the connecting plate and an opposite end portion thereof is joined to said substrate; and a fixing plate, wherein a lengthwise direction of said fixing plate is parallel with a direction in which said connecting plate is sandwiched between said diaphragms;

wherein said connecting-plate of each of said plurality of displacement control devices is driven by said piezoelectric/electrostrictive elements to create a hysteresis displacement locus, and wherein said connecting plates are disposed so that their center lines run substantially parallel with each other.

31. An actuator including a plurality of displacement control devices arranged circumferentially around a recess formed in a substrate, each of said displacement control devices comprising:

a substrate;

two diaphragms joined to at least side surfaces of recess sections made in said substrate, said recess sections being in opposed relation to each other;

at least one piezoelectric/electrostrictive element disposed on each of said diaphragms independent from one another;

a connecting plate whose one end portion, in a lengthwise direction, is sandwiched between at least said two diaphragms, and whose other end portion, in the lengthwise direction, is sandwiched between at least two different diaphragms, said connecting plate being placed to span between bottom surfaces of said recess sections, so that at least one end portion of each of said four diaphragms is joined to the connecting plate and an opposite end portion thereof is joined to said substrate; and a fixing plate, wherein a lengthwise direction of said fixing plate is parallel with a direction in which said connecting plate is sandwiched between said diaphragms;

wherein said connecting plate of each of said plurality of displacement control devices is driven by said piezoelectric/electrostrictive elements to create a hysteresis displacement locus.

* * * * *